(12) United States Patent
Yagi

(10) Patent No.: US 7,750,440 B2
(45) Date of Patent: Jul. 6, 2010

(54) SEMICONDUCTOR FILM AND MANUFACTURING METHOD THEREOF, LIGHT RECEIVING ELEMENT USING SEMICONDUCTOR FILM, ELECTROPHOTOGRAPHIC PHOTORECEPTOR, PROCESS CARTRIDGE, AND IMAGE FORMING DEVICE

(75) Inventor: Shigeru Yagi, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 269 days.

(21) Appl. No.: 11/513,258

(22) Filed: Aug. 31, 2006

(65) Prior Publication Data

US 2007/0252129 A1 Nov. 1, 2007

(30) Foreign Application Priority Data

May 1, 2006 (JP) .............................. 2006-127822

(51) Int. Cl.
 *H01L 29/20* (2006.01)
 *H01L 29/786* (2006.01)

(52) U.S. Cl. .................. 257/615; 257/43; 257/E29.089

(58) Field of Classification Search ...................... 257/2, 257/43, 431, 615
 See application file for complete search history.

(56) References Cited

U.S. PATENT DOCUMENTS

| 4,397,930 A | * | 8/1983 | Killat et al. .................... 430/50 |
| 4,780,387 A | * | 10/1988 | Shirai et al. .................... 430/60 |
| 4,788,120 A | * | 11/1988 | Shirai et al. .................... 430/66 |
| 5,961,726 A | * | 10/1999 | Aoike ...................... 118/723 E |
| 2005/0037274 A1 | * | 2/2005 | Shida et al. .................... 430/60 |
| 2005/0274409 A1 | * | 12/2005 | Fetzer et al. ................. 136/249 |

FOREIGN PATENT DOCUMENTS

| JP | A 2-110470 | 4/1990 |
| JP | A 10-45404 | 2/1998 |
| JP | A 11-186571 | 7/1999 |
| JP | A 2003-27238 | 1/2003 |
| JP | A 2003-29437 | 1/2003 |
| JP | A 2003-316053 | 11/2003 |

OTHER PUBLICATIONS

"Foundamentals of Amorphous Semiconductors" Ohmsha, ltd., pp. 173-175. 1982.
H. Reuter et al., "Thin Solid Films," vol. 254 (1995), pp. 96-102.
Journal of Non-Crystalline Solids 114 (1989), pp. 732-734.
Journal of Non-Crystalline Solids 194 (1996), pp. 103-108.

* cited by examiner

*Primary Examiner*—Sue Purvis
*Assistant Examiner*—Selim Ahmed
(74) *Attorney, Agent, or Firm*—Oliff & Berridge, PLC

(57) ABSTRACT

There is provided: a semiconductor film formed on a base material, containing a group 13 element, nitrogen, and oxygen in an amount of about 15 atomic % or more; a manufacturing method thereof; a light receiving element using the semiconductor film; an electrophotographic photoreceptor; a process cartridge; and an image forming device.

15 Claims, 7 Drawing Sheets

SEMICONDUCTOR FILM AND MANUFACTURING METHOD THEREOF, LIGHT RECEIVING ELEMENT USING SEMICONDUCTOR FILM, ELECTROPHOTOGRAPHIC PHOTORECEPTOR, PROCESS CARTRIDGE, AND IMAGE FORMING DEVICE

BACKGROUND

1. Technical Field

An aspect of the present invention relates to a semiconductor film containing a group 13 element, nitrogen, and oxygen and a manufacturing method thereof, a light receiving element using the semiconductor film, an electrophotographic photoreceptor, a process cartridge, and an image forming device.

2. Related Art

To date, as a non-single crystal optical semiconductor, amorphous chalcogenide compounds such as selenium and tellurium have been conventionally used as a photoelectric conversion member for a camera tube, a light receiving element, an electrophotographic photoreceptor, and the like. Moreover, recently hydrogenated amorphous silicon has been used for a solar battery, an image sensor, a thin film transistor, an electrophotographic photoreceptor, and the like.

On the other hand, an amorphous material of a group III-V compound semiconductor has been discussed (group number by IUPAC Nomenclature of Inorganic Compounds 1989 revised edition, group III (IIIb) is group 13, group V is group 15).

Conventionally, an amorphous material of a group III-V compound semiconductor is film-formed by vapor deposition or sputtering of a group III-V crystal, alternatively by a reaction between an atomic group III metal, and a molecule or an activated molecule including a group V element. Moreover, a group III-V film is formed on a heated substrate by so-called MOCVD (Metal Organic Chemical Vapor Deposition), using an organometallic compound including a group III metal and an organometallic compound including a group V element.

On the other hand, it is reported that, if this semiconductor contains a lot of oxygen, carbons, and hydrogen, the structure becomes two dimensional and soft, thus unstable.

Moreover, recently, electrophotography is widely used for a copier, a printer, and the like. An electrophotographic photoreceptor (hereunder, also called a "photoreceptor") used for an image forming device utilizing such electrophotography is subject to various contact or stress in the device, causing deterioration. However, on the other hand, high reliability is desired together with digitalization and colorization of the image forming device.

From such a background, a longer lifetime is desired for an electrophotographic photoreceptor. Since abrasion resistance is needed to be improved for a longer lifetime of the electrophotographic photoreceptor, the hardness of the photoreceptor surface is required to be increased.

SUMMARY

According to an aspect of the invention, there is provided a semiconductor film formed on a base material, containing a group 13 element, nitrogen, and oxygen in an amount of about 15 atomic % or more.

BRIEF DESCRIPTION OF THE DRAWINGS

Exemplary embodiments of the present invention will be described in detail based on the following figures, wherein.

DETAILED DESCRIPTION (Semiconductor Film)

Figure 1:
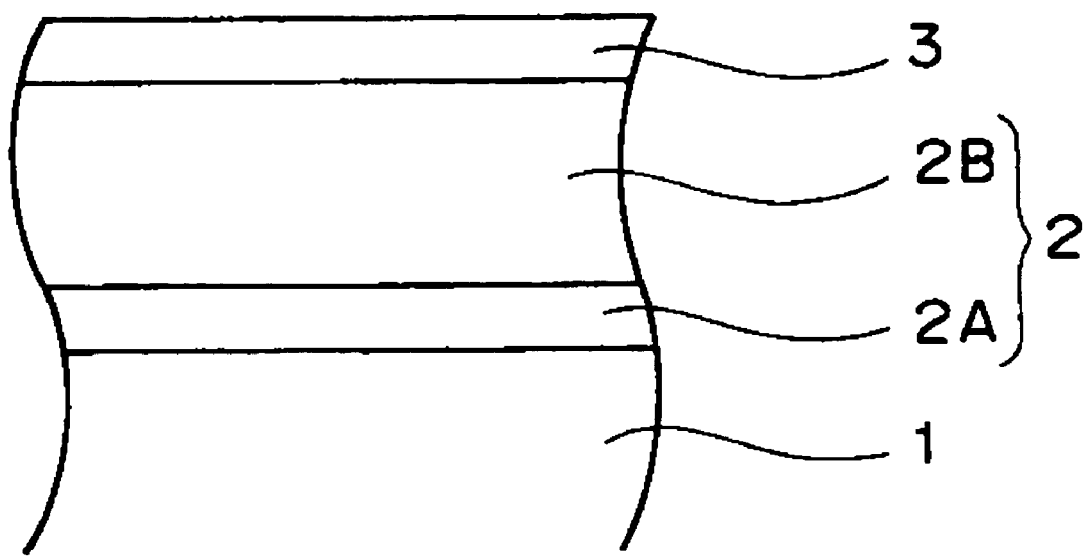
FIG. 1 is a schematic cross-section showing an example of a layer structure of a photoreceptor of an exemplary embodiment of the present invention.

The semiconductor film of an exemplary embodiment of the present invention is formed on a base material, and contains a group 13 element, nitrogen, and oxygen in an amount of 15 atomic % or more.

The semiconductor film of an exemplary embodiment of the present invention is a group 13 oxynitride semiconductor containing a group 13 element, nitrogen, and oxygen.

The semiconductor film of an exemplary embodiment of the present invention may contain only a group 13 element, nitrogen, and oxygen in an amount of 15 atomic % or more, however it may also contain a fourth element such as hydrogen additionally as required. It may contain hydrogen. In this case, hydrogen compensates dangling bonds or structural defects that have been generated by bonds between the group 13 element, nitrogen, and oxygen. Thereby electrical stability, chemical stability, and mechanical stability may be improved, and an excellent water repellency and a low frictional coefficient on the surface of the semiconductor film may be obtained.

The composition in the thickness direction of the semiconductor film may be even. However the composition may have an inclined structure or may have a multilayer structure in the thickness direction of the film as long as it contains a group 13 element, nitrogen, and oxygen in an amount of 15 atomic % or more.

It may be such that the distribution of nitrogen concentration in the thickness direction of the semiconductor film is increased toward the base material side, and the distribution of oxygen concentration is decreased toward the base material side. Conversely, it may be such that the distribution of nitrogen concentration in the thickness direction of the semiconductor film is decreased toward the base material side, and the distribution of oxygen concentration is increased toward the base material side.

The ratio of the number of atoms of the sum of nitrogen and oxygen content and the group 13 element may be 0.5:1 to 3:1. If it is out of this range, a part formed with a tetrahedral bond may become like an ion molecular bond, and a sufficient chemical stability or hardness may not be obtained.

Moreover, the oxygen content in the semiconductor film is required to be 15 atomic % or more, preferably 28 atomic % or more, and more preferably 37 atomic % or more.

From the viewpoint of maintaining the oxidation resistance, the oxygen content may be considerable. However, many of the molecular bonds between elements in the semiconductor film are in two dimensional arrangement, and thus the hardness may not be sufficient and the film may become fragile. Accordingly, the oxygen content may be 65 atomic % or less in practice. The nitrogen content in the semiconductor film may be 1 atomic % or more.

Here, if hydrogen is contained in the semiconductor film, the hydrogen content in the semiconductor film is preferably within a range of 0.1 atomic % or more but 30 atomic % or less, and more preferably within a range of 0.5 atomic % or more but 20 atomic % or less.

If the hydrogen content is less than 0.1 atomic %, structural turbulence is kept inside the film, and thus the film may become electrically unstable and the mechanical characteristic may also become insufficient. Moreover, if it exceeds 30 atomic %, there is an increased probability that more than two hydrogen atoms are bonded with a group 13 element and a nitrogen atom, and therefore a three dimensional structure can not be maintained, and the hardness, the chemical stability (in particular, moisture resistance), and the like may be insufficient.

Moreover, the hydrogen content in the semiconductor film is preferably within a range of 0.1 atomic % or more and 50 atomic % or less with respect to the whole main two elements (group 13 element and oxygen) constituting the semiconductor film, and more preferably a range of 1 atomic % or more and 40 atomic % or less.

In an exemplary embodiment of the present invention, the hydrogen content in the semiconductor film means a value obtained by Hydrogen Forward Scattering (HFS).

For the HFS, an accelerator (trade name: 3SDH PELLETRON, manufactured by National Electrostatic Corporation), and an endstation (trade name: RBS-400, manufactured by CE&A (Charles Evans and Associates)) are used, and a 3S-R10 is used as the system. The HYPRA program of Charles Evans & Associates is used for analysis. The measurement conditions of the HFS are as follows.

He$^{++}$ Ion Beam Energy: 2.275 eV

Detection Angle 160°

Grazing Angle with respect to incident beam 30°

In the HFS measurement, by setting the detector at 30° with respect to the He$^{++}$ ion beam, and the sample at 75° with respect to the normal line, signals of hydrogen scattered in front of the sample can be taken. At this time, preferably the detector is covered with a thin aluminum foil to remove He atoms scattered together with hydrogen. The amount is measured by comparing the hydrogen counts of the reference sample and the target sample after standardization by the stopping power. As the reference sample, an H ion injected Si sample and muscovite were used. The muscovite is known to have a hydrogen concentration of about 6.5 atomic %. H adsorbed in the most outer surface can be measured by subtracting the H amount adsorbed on a clean Si surface.

Moreover, the hydrogen content in the semiconductor film can be estimated by the strength of the group 13-hydrogen bond or the N—H bond, using infrared absorption spectrum measurement.

The semiconductor film may contain carbon. In this case, the content thereof may be 15 atomic % or less. If the carbon content exceeds 15 atomic %, carbon is present as —$CH_2$, —$CH_3$ in the semiconductor film, and thus hydrogen contained in the semiconductor film is increased, which may result in insufficient chemical stability and the like of the semiconductor film in the atmosphere.

As to the group 13 element contained in the semiconductor layer, specifically, at least one or more elements selected from B, Al, Ga, and In may be used, and the combination of two or more elements selected therefrom may be also used.

In this case, the combination of contents of these atoms in the semiconductor is not limited. However, among these four elements, In has an absorption in the visible light region, and the other elements do not have an absorption in visible light region. Therefore, by appropriately selecting the group 13 element to be used, it is possible to optionally adjust the sensitive wavelength region of the semiconductor film with respect to light. For example, if the semiconductor film of an exemplary embodiment of the present invention is used as the photoconductive layer of a light receiving element, the element can be selected so that the sensitive wavelength region is in the visible light region. Moreover, if the semiconductor film of an exemplary embodiment of the present invention is used as the surface layer of a light receiving element, it is necessary to select the element so as to absorb as little light as possible with respect to the exposure wavelength or the erase wavelength of an electrophotographic device including this photoreceptor.

In an exemplary embodiment of the present invention, the content of an element such as a group 13 element, nitrogen, oxygen, and carbon in the semiconductor film means the value obtained by Rutherford Backscattering (RBS) including the distribution in the film thickness direction.

For the RBS: an accelerator (trade name: 3SDH PELLETRON, manufactured by National Electrostatic Corporation), and an endstation (trade name: RBS-400, manufactured by CE&A (Charles Evans and Associates)) are used, and a 3S-R10 is used as a system. The HYPRA program of Charles Evans & Associates is used for analysis.

The measurement conditions of the RBS are as follows:

He$^{++}$ Ion Beam Energy: 2.275 eV

Detection Angle 160°

Grazing Angle with respect to incident beam about 109°

In the RBS measurement, the He$^{++}$ ion beam is incident orthogonally to the sample, and the detector is set at 160° with respect to the ion beam, so as to measure signals of He backscattered. From the detected energy and intensity of He, the composition ratio and the film thickness are determined.

In order to improve the accuracy of obtaining the composition ratio and the film thickness, the spectrum may be measured with two detection angles. The accuracy can be improved by measuring and cross checking with two different detection angles having different resolutions in the depth direction and different backscattering dynamics.

The number of He atoms backscattered is determined by three factors of; 1) atomic number of the target atom, 2) energy of the He atoms before scattering, and 3) scattering angle.

The density is assumed by calculation from the measured composition, and the film thickness is calculated using this. The error of the density is within 20%.

The content of each element in the whole semiconductor film can be also measured by X-ray photoelectron spectroscopy (XPS) or secondary electron mass spectrometry.

The crystalline/amorphism of the semiconductor film is not specifically limited, and may be any one of micro crystallite, polycrystalline, and amorphous.

The semiconductor film may be amorphous including crystallite or crystallite/polycrystalline including amorphous, from the point of stability and hardness, however it is preferably amorphous from the point of smoothness and friction of the surface of the semiconductor film. The crystalline/amorphism can be determined by the presence/absence of points or lines of the diffraction figure obtained by RHEED (reflection high energy electron diffraction) measurement. Moreover, the amorphism can be determined by the absence of a sharp peak peculiar to the angle of diffraction, by means of X-ray diffraction spectroscopy.

The semiconductor film may be added with various dopants in order to control the conduction type or conductivity. If the conductivity of the semiconductor film is controlled to n-type, for example one or more elements selected from Si, Ge, and Sn can be used. If it is controlled to p-type, for example one or more elements selected from Be, Mg, Ga, Zn, and Sr can be used. Moreover, such a semiconductor that is normally not doped is often n-type, and elements used for p-type modification may be further used to increase the dark resistance.

In the semiconductor film of an exemplary embodiment of the present invention, in any case where the crystalline/amorphism is micro crystallite, polycrystalline, or amorphous, the internal structure tends to include a lot of bonding defects, dislocation defects, defects of crystal grain boundary, and the like. Therefore, in order to deactivate these defects, the semiconductor film may contain hydrogen and/or halogen. The hydrogen or halogen in the semiconductor film is taken into bonding defects or the like, having functions of quenching reaction active spots and compensating electrically. Therefore, traps related to diffusion and movement of carriers in the semiconductor film may be suppressed.

As a result, when the semiconductor film of an exemplary embodiment of the present invention contains hydrogen and/or halogen and is used for the photoconductive layer of the light receiving element, the photoelectric current in the light receiving element may be stabilized. If the semiconductor film of an exemplary embodiment of the present invention is used for the surface layer of the light receiving element, the residual charge on the photoreceptor surface due to the internal accumulation of charge when electrification and exposure are repeated, and the cycle up thereof can be suppressed, and the electrification characteristic may be more stabilized.

(Light Receiving Element)

Next is a description of the light receiving element using the semiconductor film of an exemplary embodiment of the present invention. The light receiving element of an exemplary embodiment of the present invention includes a conductive base substance, a photoconductive layer, and an electrode. As a layer constituting the photoconductive layer, the semiconductor film of an exemplary embodiment of the present invention is used.

The semiconductor film of an exemplary embodiment of the present invention acts as a photoconductive layer of the light receiving element. It may be such that the photoconductivity occurs in an electric field applied from the outside, or it may be such that an inner voltage is generated between the conductive base substance and the electrode, which shows the photoconductivity as a photoelectromotive current.

As the conductive base substance used for the light receiving element of an exemplary embodiment of the present invention, there may be used a conductive substrate or an insulating substrate provided with an electrode on the face in contact with the photoconductive layer. These conductive substrate and the nonconductive substrate may be any one of crystal or amorphous.

The conductive substrate may include metals such as aluminum, stainless steel, nickel, and chromium, and alloy crystals thereof, and semiconductors such as Si, GaAs, SiC, and ZnO.

Moreover, the insulating substrate may include a polymeric film, a glass, quartz, and ceramics. Regarding the formation of the electrode (conduction processing), the metals mentioned above, gold, silver, copper, or the like may be formed into a film on the insulating substrate by means of the deposition method, the sputtering method, the ion plating method, or the like.

If the light receiving element of an exemplary embodiment of the present invention inputs (or receives) light via the conductive base substance into the photoconductive layer, a translucent substrate having a transmittance with respect to light is used as the conductive base substance. As such a translucent material, there may be used transparent inorganic materials such as glass, quartz, and sapphire, transparent organic resin films or plate such as of fluorine contained resin, polyester, polycarbonate, polyethylene, polyethylene terephthalate (hereunder, also called "PET"), and epoxy, and furthermore an optical fiber, SELFOC optical plate, and the like.

As to the electrode provided on the translucent substrate, there may be used a translucent electrode. For such an electrode, there are used a transparent conductive material such as ITO (Indium Tin Oxide), zinc oxide, stannic oxide, lead oxide, indium oxide, and copper iodide formed by means of vapor deposition, ion plating, sputtering, or the like, or a metal such as Al, Ni, and Au formed thin to the degree of being semitransparent by vapor deposition or sputtering.

For the photoconductive layer, there may be used a semiconductor film of a single layer adjusted into undoped, p-type, i-type, or n-type, a p-n junction formed by laminating a p-type layer and an n-type layer, or a multilayer structure provided with an i-type layer between a p-type layer and an n-type layer. In the case of the multilayer structure, as a layer in contact with the electrode of the photoconductive layer, there may be used a p+-type layer or an n+-type layer doped with a higher concentration of an element for p-type or n-type adjustment. Moreover, a multilayer structure having a unit of pn-structure or pin-structure may be formed. Furthermore, for the purpose of transparency or barrier formation, these p-type, i-type, and n-type layers may respectively have different compositions, or each p-type, i-type, and n-type layer may comprise a plurality of layers of different compositions.

Regarding the film thickness, each layer may be 1 nm to several dozen μms. The same film thickness may be laminated or repeated, or different film thicknesses may be laminated or repeated. It may be appropriately set according to the optical absorption rate, the electric field of the active site, the barrier length, or the like.

If the photoconductive layer has a single layer structure, the photoconductive layer includes a semiconductor film of an exemplary embodiment of the present invention. However, if the photoconductive layer has a multilayer structure, at least any one layer may be the semiconductor film of an exemplary embodiment of the present invention, or all layers may be the semiconductor film of an exemplary embodiment of the present invention.

Moreover, as to the construction material of an electrode separately provided from the photoconductivity base substance which functions as the electrode, there may be used the abovementioned materials of the translucent electrode and the like. Moreover, there may be also used a metal such as Al, Ni, Au, Ni, Co, and Ag formed thin by deposition or sputtering. If light is input (or received) from the side provided with this electrode into the photoconductive layer, the electrode is formed thin from a metal such as Al, Ni, Au, Ni, Co, and Ag by vapor deposition or sputtering so that the light can transmit therethrough. The thickness may be 5 nm to 100 nm. If the electrode is too thin, the light transmittance is high but the electrical resistance may be high. Moreover, as the electrode, an oxide semiconductor that is transparent for ultraviolet light may be also used.

If a insulating substrate provided with an electrode on the face in contact with the photoconductive layer is used as the conductive base substance, an organic polymeric film may be particularly used as this insulating substrate. If a transparent organic polymeric film is used as the insulating substrate, then on the surface of this substrate is formed a transparent conductive electrode of ITO, zinc oxide, stannic oxide, lead oxide, indium oxide, copper iodide, or the like.

(Electrophotographic Photoreceptor)

Next is a description of an electrophotographic photoreceptor using the semiconductor film of an exemplary embodiment of the present invention.

The electrophotographic photoreceptor of an exemplary embodiment of the present invention includes a conductive base substance, a photosensitive layer, and a surface layer. On the conductive base substance is laminated the photosensitive layer and the surface layer in this order. The semiconductor film of an exemplary embodiment of the present invention is used as the surface layer.

If the surface layer contains hydrogen, since the surface energy of the most outer surface of the surface layer is reduced, the discharged products may be prevented from being adhered, and the occurrence of image defects caused by the adhesion of discharged products may be suppressed. In addition, since the frictional coefficient on the most outer surface of the surface layer is reduced, the development of wear and blemish occurrence may be further suppressed.

From the viewpoint of lowering the energy and the friction on the most outer surface of the surface layer, the hydrogen content in the surface layer is preferably 0.1 atomic % or more, and more preferably 0.5 atomic % or more.

The photoreceptor of an exemplary embodiment of the present invention is not specifically limited as long as the layer structure is such that on the conductive base substance is laminated the photosensitive layer and the surface layer in this order, and between these three layers may be provided an intermediate layer such as an under coating layer as required. Moreover, the photosensitive layer may have two layers or more, and additionally may be a function separation type. Furthermore, the photoreceptor of an exemplary embodiment of the present invention may be a so-called amorphous silicon photoreceptor where the photosensitive layer contains silicon atoms, or may be a so-called organic photoreceptor where the photosensitive layer contains organic materials such as organic photosensitive materials or the like. In the case of an organic photoreceptor, wearing often occurs, however if the semiconductor film of an exemplary embodiment of the present invention is used as the surface layer, wearing may be suppressed. Hereunder is a more detailed description of specific examples of the layer structure of the photoreceptor of an exemplary embodiment of the present invention, with reference to the drawings.

FIG. 1 is a schematic cross-section showing an example of a layer structure of a photoreceptor of an exemplary embodiment of the present invention, wherein 1 denotes a conductive base substance, 2 denotes a photosensitive layer, 2A denotes a charge generation layer, 2B denotes a charge transport layer, and 3 denotes a surface layer.

The photoreceptor shown in FIG. 1 has a layer structure where on the conductive base substance 1 is laminated with the charge generation layer 2A, the charge transport layer 2B, and the surface layer 3 in this order. The photosensitive layer 2 includes two layers of the charge generation layer 2A and the charge transport layer 2B.

Figure 2:
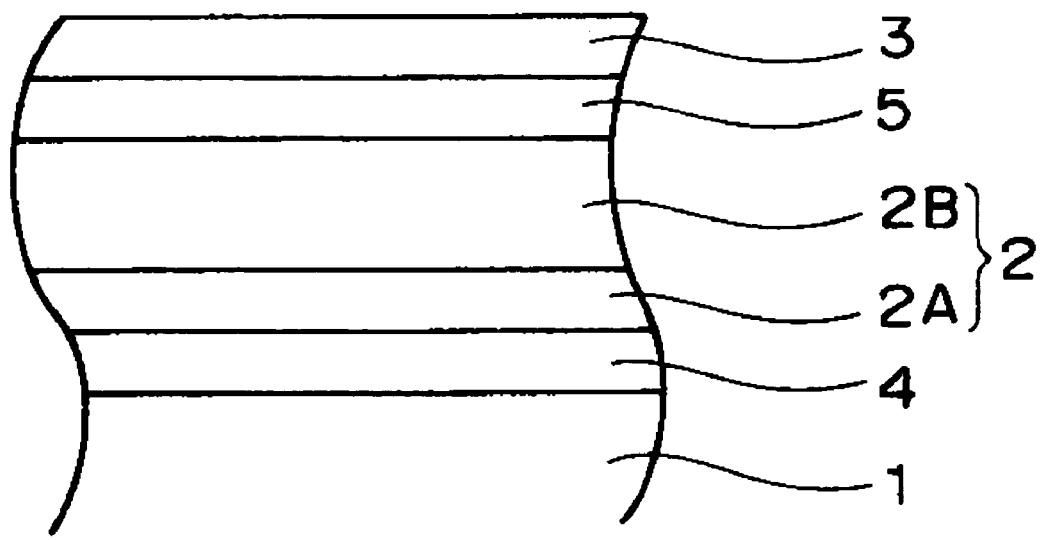
FIG. 2 is a schematic cross-section showing another example of a layer structure of the photoreceptor of an exemplary embodiment of the present invention.

FIG. 2 is a schematic cross-section showing another example of a layer structure of the photoreceptor of an exemplary embodiment of the present invention, wherein 4 denotes an under coating layer, 5 denotes an intermediate layer, and the others are the same as shown in FIG. 1.

The photoreceptor shown in FIG. 2 has a layer structure where on the conductive base substance 1 is laminated with the under coating layer 4, the charge generation layer 2A, the charge transport layer 2B, the intermediate layer 5, and the surface layer 3 in this order.

Figure 3:
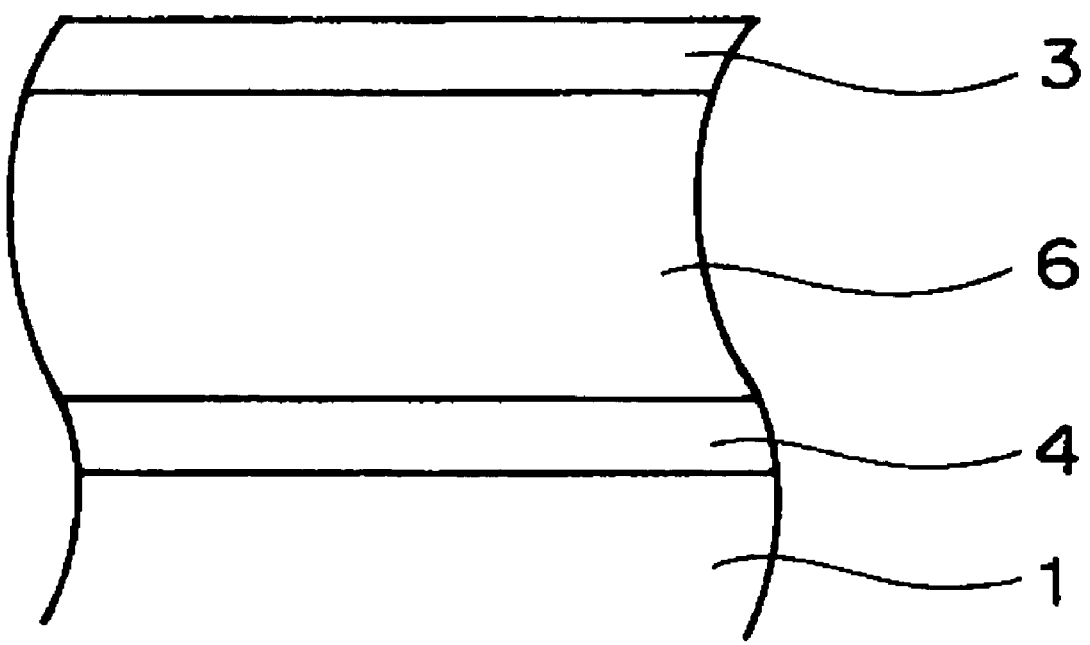
FIG. 3 is a schematic cross-section showing yet another example of a layer structure of the photoreceptor of an exemplary embodiment of the present invention.

FIG. 3 is a schematic cross-section showing an example of a layer structure of a photoreceptor of an exemplary embodiment of the present invention, wherein 6 denotes the photosensitive layer and the others are the same as shown in FIG. 1 and FIG. 2.

The photoreceptor shown in FIG. 3 has a layer structure where on the conductive base substance 1 is laminated with the photosensitive layer 6 and the surface layer 3 in this order. The photosensitive layer 7 is a layer having integrated functions of a charge generation layer 2A and the charge transport layer 2B shown in FIG. 1 and FIG. 2.

The photosensitive layers 2 and 6 may be formed from an organic polymer, may be formed from inorganic material, or may be a combination thereof.

-Organic Photoreceptor-

Next is a description of the outline of an example of a structure where the photoreceptor of an exemplary embodiment of the present invention is an organic photoreceptor.

The organic polymer compound forming the photosensitive layer may be thermoplastic or thermosetting, or it may be formed by reacting two types of molecules. Moreover, between the photosensitive layer and the surface layer may be provided an intermediate layer from the viewpoints of adjusting the hardness, the coefficient of expansion, and the elasticity, improving the adhesiveness, and the like. The intermediate layer suitably shows intermediate characteristics with respect to both of the physical characteristics of the surface layer and the physical characteristics of the photosensitive layer (charge transport layer in the case of the function separation type). Moreover, if the intermediate layer is provided, the intermediate layer may act as a layer which traps charges.

In the case of the organic photoreceptor, the photosensitive layer may be a function separation type having the charge generation layer and the charge transport layer separately as shown in FIG. 1 and FIG. 2, or may be a function integration type as shown in FIG. 3. In the case of the function separation type, the surface side of the photoreceptor may be provided with the charge generation layer, or the surface side may be provided with the charge transport layer.

If a surface layer is formed on the photosensitive layer by a method described later, in order to prevent decomposition of the photosensitive layer due to the irradiation of electromagnetic radiation of shorter wavelengths other than heat, the photosensitive layer surface may be previously provided with a short-wavelength light absorber layer against ultraviolet light or the like, prior to formation of the surface layer. Moreover, so as not to irradiate short-wavelength light onto the photosensitive layer, a layer having a small band gap may be firstly formed at the initial stage for forming the surface layer. As to the composition of such a layer having a small band gap provided on the photosensitive layer side, for example the ratio of the group 13 element ratio including In is suitably $Ga_xIn_{(1-x)}(0 \leqq X \leqq 0.99)$. Regarding oxygen and nitrogen, the same conditions as described above are used.

Moreover, the layer containing an ultraviolet absorber (for example, a layer formed by application or the like of a layer dispersed in a polymeric resin) may be provided on the photosensitive layer surface.

In this manner, prior to formation of the surface layer, the photoreceptor surface is provided with the intermediate layer, and thereby effects on the photosensitive layer by short-wavelength light such as ultraviolet light when forming the surface layer, corona discharge if the photoreceptor is used in the image forming device, or ultraviolet light from other various light sources may be prevented.

-Amorphous Silicon Photoreceptor-

Next is a description of the outline of an example of a structure where the photoreceptor of an exemplary embodiment of the present invention is an amorphous silicon photoreceptor.

The amorphous silicon photoreceptor may be a photoreceptor for either positive electrification or negative electrification. There may be used one such that on the conductive substrate is formed an under coating layer for blocking charge injection or improving the adhesiveness, and next is provided a photoconductive layer and a surface layer. The surface layer may be such that on the surface of the photosensitive layer is provided with an intermediate layer, on the surface of which is further provided with a surface layer. Or, on the surface of the photosensitive layer may be directly provided a surface layer.

Moreover, the most outer layer (layer on the surface layer side) of the photosensitive layer may be p-type amorphous silicon, or n-type amorphous silicon. Between the photosensitive layer and the surface layer may be formed with for example a $Si_xO(1-x):H$, $Si_xN(1-x):H$, $Si_xC(1-x):H$, amorphous carbon layer as an intermediate layer (charge injection blocking layer).

-Surface Layer-

Next is a detailed description of preferable characteristic and the like of the surface layer of an exemplary embodiment of the present invention.

As described above, the surface layer may be either amorphous or crystalline. However, in order to improve the adhesiveness with the photosensitive layer (or the intermediate layer), and to improve the smoothness of the photoreceptor surface, the surface layer may be amorphous. Moreover, the lower layer of the surface layer (photosensitive layer side) may be micro crystallite, and the upper layer (photoreceptor surface side) may be amorphous.

Regarding the surface layer, injection into the surface layer may be performed at the time of electrification. In this case, it is necessary for charges to be trapped in the interface between the surface layer and the photosensitive layer. Moreover, the charges may be trapped on the surface of the surface layer. For example, as shown in FIG. 1 and FIG. 2, if the photosensitive layer is the function separation type, when electrons are injected into the surface layer by negative electrification, the surface of the charge transport layer on the surface layer may act as a charge trap. Moreover, between the charge transport layer and the surface layer may be provided an intermediate layer for blocking charge injection or improving the adhesiveness. This may be similarly performed in the case of positive electrification, too.

The thickness of the surface layer may be within a range between 0.01 μm and 5 μm. If the thickness is less than 0.01 μm, it is susceptible to the effect of the photosensitive layer, and the mechanical strength may be insufficient. Moreover, if the thickness is 5 μm or more, residual charge is increased due to the repetition of electrification exposure. Furthermore the mechanical internal stress with respect to the photosensitive layer is increased, and exfoliation or cracking may often occur.

Moreover, the surface layer may have a function as the charge injection blocking layer, or may also have a function as the charge injection layer. In this case, as described above, by adjusting the conduction type of the semiconductor film of the surface layer to n-type or p-type, the surface layer may act as the charge injection blocking layer, or as the charge injection layer too.

If the surface layer acts as the charge injection layer, charges are trapped on the intermediate layer or the surface of the photosensitive layer (surface on the surface layer side). In the case of negative electrification, an n-type surface layer acts as the charge injection layer and a p-type surface layer acts as the charge injection blocking layer. In the case of positive electrification, an n-type surface layer acts as the charge injection blocking layer and a p-type surface layer acts as the charge injection layer.

Moreover, in order to maintain the electrostatic latent image, a high resistant i-type semiconductor film may be formed as the surface layer.

-Conductive Base Substance and Photosensitive Layer-

Next is a description of details of the conductive base substance and the photosensitive layer of the electrophotographic photoreceptor of an exemplary embodiment of the present invention, and details of the under coating layer and the intermediate layer provided as required, in the case where the electrophotographic photoreceptor of an exemplary embodiment of the present invention is for an organic photoreceptor having the function separation type photosensitive layer.

-Conductive Base Substance-

The conductive base substance includes: a metal drum of for example aluminum, copper, iron, stainless, zinc, and nickel; a metal such as aluminum, copper, gold, silver, platinum, palladium, titanium, nickel-chromium, stainless steel, and copper-indium deposited on a base material such as a sheet, a paper, a plastic, and a glass; a conductive metal compound such as indium oxide and tin oxide deposited on the base material; a metal foil laminated on the base material; and carbon black, indium oxide, tin oxide-antimony oxide powder, metal powder, copper iodide, and the like dispersed into a binder resin and applied on the base material for conduction treatment. Moreover, the shape of the conductive base substance may be any one of drum shape, sheet shape, and plate shape.

Moreover, if a metal pipe base substance is used as the conductive base substance, the surface of the metal pipe base substance may be the original pipe as it is. However, it is also possible to roughen the surface of the base substance surface by a surface treatment in advance. Such a surface roughening can prevent the uneven concentration in the grain form due to the coherent light which may occur in the photoreceptor if a coherent light source such as a laser beam is used as an exposure light source. The method of surface treatment includes specular cutting, etching, anodization, rough cutting, centerless grinding, sandblast, and wet honing.

In particular, from the point of improving the adhesiveness with the photosensitive layer and improving the film forming property, one having an anodized surface of the aluminum base substance may be used as the conductive base substance.

Hereunder is a description of a method of manufacturing the conductive base substance having the anodized surface. First, as to the base substance, pure aluminum or aluminum alloy (for example, aluminum or aluminum alloy of an alloy number between 1000 and 1999, between 3000 and 3999, or between 6000 and 6999 defined in JISH4080, the disclosure of which is incorporated by reference) is prepared. Next, anodization is performed. The anodization is performed in an acid solution of for example chromic acid, sulfuric acid, oxalic acid, phosphoric acid, boric acid, and sulfamic acid. However, treatment using a sulfuric acid solution is often used. The anodization is performed for example under a condition of about sulfuric acid concentration: 10 weight % or more and 20 weight % or less: bath temperature: 5° C. or more and 25° C. or less, current density: 1 $A/dm^2$ or more and 4 $A/dm^2$ or less, bath voltage: 5V or more and 30V or less, and treatment time: 5 minutes or more and 60 minutes or less, however it is not limited to this.

The anodized film formed on the aluminum base substance in this manner is porous and highly insulative, and has a very unstable surface. Therefore, after forming the film, the physical characteristics value is easily changed with time. In order to prevent this change of the physical characteristics value, the anodized film is further sealed. The sealing method includes a method of soaking the anodized film in an aqueous solution containing nickel fluoride or nickel acetate, a method of soaking the anodized film in boiling water, and a method of treating by steam under pressure. Among these methods, the method of soaking in an aqueous solution containing nickel acetate is most often used.

On the surface of the anodized film that has been sealed in this manner, metal salts and the like adhered by the sealing remain in excess. If such metal salts and the like remain in excess on the anodized film of the base substance, not only the quality of the coating film formed on the anodized film is badly affected, but also low resistant components tend to remain in general. Therefore, if this base substance is used for the photoreceptor to form an image, it becomes the causative factor of scumming.

Here, following the sealing, washing of the anodized film is performed in order to remove the metal salts and the like adhered by the sealing. The washing may be such that the base substance is washed once, however it may be such that the base substance is washed by multisteps of washing. As this time, as the washing solution at the last washing step, there is used clean (deionized) washing solution as much as possible. Moreover, in any one step among the multisteps of washing, a physical rubbing washing using a contact member such as a brush may be performed.

The thickness of the anodized film on the surface of the conductive base substance formed as above may be within a range of 3 μm or more and 15 μm or less. On the anodized film is present a layer called a barrier layer along the porous shaped most outer surface of a porous anodized film. The thickness of the barrier layer may be within a range of 1 nm or more and 100 nm or less in the photoreceptor used in an exemplary embodiment of the present invention. In the above manner, the anodized conductive base substance can be obtained.

In the conductive base substance obtained in this manner, the anodized film formed on the base substance by anodization has a high carrier blocking property. Therefore, the photoreceptor using this conductive base substance can be installed in the image forming device so as to prevent point defects (black dots and scumming) occurring if print off development (negative/positive development) is performed, and to prevent current leak phenomenon from a contact electrification device which often occurs at the time of contact electrification. Moreover, by sealing the anodized film, the change of the physical characteristics value with time after forming the anodized film, may be prevented. Moreover, by washing the conductive base substance after sealing, the metal salts and the like adhered on the surface of the conductive base substance by sealing may be removed. If an image is formed by an image forming device comprising a photoreceptor produced using this conductive base substance, the occurrence of scumming can be sufficiently prevented.

-Under Coating Layer-

Next is a description of the under coating layer. The material of the under coating layer includes: a polymeric resin compound such as an acetal resin such as polyvinyl butyral; a polyvinylalcohol resin, casein, a polyamide resin, a cellulose resin, a gelatin, a polyurethane resin, a polyester resin, a methacrylic resin, an acrylic resin, a polyvinylchloride resin, a polyvinyl acetate resin, a vinyl chloride-vinyl acetate-maleic anhydride resin, a silicone resin, a silicone-alkyd resin, a phenol-formaldehyde resin, and a melamine resin; and in addition, an organometallic compound containing zirconium, titanium, aluminum, manganese, silicon atoms, and the like.

These compounds may be used solely, or as a mixture or polycondensate of a plurality of compounds. Among them, an organometallic compound containing zirconium or silicon is preferably used since it has a low residual charge, low potential change due to environment, and low potential change due to repetitive usage. Moreover, the organometallic compound may be used solely, or as a mixture of a plurality of types, or a mixture with the abovementioned binder resin.

The organic silicon compound (organometallic compound containing silicon atoms) includes vinyltrimethoxysilane, γ-methacryloxypropyl-tris(β-methoxyethoxy)silane, β-(3,4-epoxycyclohexyl)ethyltrimethoxysilane, γ-glycidoxypropyltrimethoxysilane, vinyltriacetoxysilane, γ-mercaptopropyltrimethoxysilane, γ-aminopropyltriethoxysilane, N-β-(aminoethyl)-γ-aminopropyltrimethoxysilane, N-β-(aminoethyl)-γ-aminopropylmethylmethoxysilane, N,N-bis (β-hydroxyethyl)-γ-aminopropyltriethoxysilane, and γ-chloropropyltrimethoxysilane. Among them, there is preferably used a silane coupling agent such as vinyltriethoxysilane, vinyltris(2-methoxyethoxysilane), 3-methacryloxypropyltrimethoxysilane, 3-glycidoxypropyltrimethoxysilane, 2-(3,4-epoxycyclohexyl)ethyltrimethoxysilane, N-2-(aminoethyl)3-aminopropyltrimethoxysilane, N-2-(aminoethyl) 3-aminopropylmethyldimethoxysilane, 3-aminopropyltriethoxysilane, N-phenyl-3-aminopropyltrimethoxysilane, 3-mercaptopropyltrimethoxysilane, and 3-chloropropyltrimethoxysilane.

The organic zirconium compound (organometallic compound containing zirconium) includes zirconium butoxide, ethyl zirconium acetoacetate, zirconium triethanolamine, acetylacetonato zirconium butoxide, ethyl acetoacetate zirconium butoxide, zirconium acetate, zirconium oxalate, zirconium lactate, zirconium phosphonate, zirconium octanoate, zirconium naphthenate, zirconium laurate, zirconium stearate, zirconium isostearate, methacrylate zirconium butoxide, stearate zirconium butoxide and isostearate zirconium butoxide.

The organic titanium compound (organometallic compound containing titanium) includes tetraisopropyl titanate, tetranormalbutyl titanate, butyl titanate dimer, tetra(2-ethylhexyl) titanate, titanium acetylacetonate, polytitanium acetylacetonate, titanium octylene glycolate, titanium lactate ammonium salt, titanium lactate, titanium lactate ethyl ester, titanium triethanolaminate and polyhydroxytitanium stearate.

The organic aluminum compound (organometallic compound containing aluminum) includes aluminum isopropylate, monobutoxyaluminum diisopropylate, aluminum butyrate, diethylacetoacetate aluminum diisopropylate and aluminum tris(ethylacetoacetate).

Moreover, the solvent used for the under coating layer forming coating liquid which is for forming the under coating layer includes a publicly known organic solvent for example: an aromatic hydrocarbon solvent, such as toluene and chlorobenzene; an aliphatic alcohol solvent, such as methanol, ethanol, n-propanol, iso-propanol and n-butanol; a ketone solvent such as acetone, cyclohexanone, and 2-butanone; a halogenated aliphatic hydrocarbon solvent such as methylene chloride, chloroform, and ethylene chloride; a cyclic or linear ether solvent such as tetrahydrofuran, dioxane, ethylene glycol, diethylether; and an ester solvent such as methyl acetate, ethyl acetate, and n-butyl acetate. These solvents may be used solely or as a mixture of a plurality of types. As a solvent which can be used when a plurality of types of solvents are mixed, any solvent may be used as long as a binder resin can be dissolved therein as a mixed solvent.

In the formation of the under coating layer, firstly an under coating layer forming coating liquid that has been formulated by dispersing and mixing under coating layer coating agent and a solvent is prepared, and applied on the surface of the conductive base substance. As the application method of the under coating layer forming coating liquid, there may be used a normal method such as a dip coating method, a ring coating method, a wire bar coating method, a spray coating method, a blade coating method, a knife coating method, and a curtain coating method. If the under coating layer is formed, it may be formed so that the thickness is within a range of 0.1 µm or more and 3 µm or less. By setting the thickness of the under coating layer within such a thickness range, potential increase due to desensitization or repetition may be prevented without overstrengthening the electrical barrier.

In this manner, by forming the under coating layer on the conductive base substance, the wettability when coating to form a layer on the under coating layer may be improved, and it can sufficiently serve a function as an electrical blocking layer.

The surface roughness of the under coating layer formed by the above can be adjusted so as to have a roughness within a range between 1 and $1/(4n)$ times the laser wavelength $\lambda$ for exposure to be used (where n is the refractive index of a layer provided on the periphery of the under coating layer). The surface roughness is adjusted by adding resin particles in the under coating layer forming coating liquid. By so doing, if the photoreceptor formed by adjusting the surface roughness of the under coating layer is used for the image forming device, interference fringes due to the laser source may be sufficiently prevented.

As the resin particles, there may be used silicone resin particles, bridge style PMMA resin particles, and the like. Moreover, for adjusting the surface roughness, the surface of the under coating layer may be ground. As the grinding method, there may be used buffing, sandblasting, wet honing, grinding treatment, and the like. In the photoreceptor used for the image forming device of the configuration of positive electrification, laser incident beams are absorbed in the vicinity of the most outer surface of the photoreceptor, and further scattered in the photosensitive layer. Therefore, it is not so strongly needed to adjust the surface roughness of the under coating layer.

Moreover, various additives may be added into the under coating layer forming coating liquid, in order to improve the electrical characteristic, the environmental stability, and the image quality. As the additive, there may be used a publicly known material, for example: an electron transport material such as a quinone compound such as chloranil, bromanil, and anthraquinone, a tetracyanoquinodimethane compound, a fluorenone compound such as 2,4,7-trinitrofluorenone and 2,4,5,7-tetranitro-9-fluorenone, an oxadiazole compound such as 2-(4-biphenyl)-5-(4-t-butylphenyl)-1,3,4-oxadiazole, 2,5-bis(4-naphthyl)-1,3,4-oxadiazole,2,5-bis(4-diethylaminophenyl)1,3,4oxadiazole, a xanthone compound, a thiophene compound, a diphenoquinone compound such as 3,3',5,5' tetra-t-butyldiphenoquinone; an electron transport pigment such as polycyclic or azo, a zirconium chelate compound, a titanium chelate compound, an aluminum chelate compound, a titanium alkoxide compound, an organic titanium compound, and a silane coupling agent.

Specific examples of the silane coupling agent used here include silane coupling agents such as vinyltrimethoxysilane, γ-methacryloxypropyl-tris(β-methoxyethoxy)silane, β-(3,4-epoxycyclohexyl)ethyltrimethoxysilane, γ-glycidoxypropyltrimethoxysilane, vinyltriacetoxysilane, γ-mercaptopropyltrimethoxysilane, γ-aminopropyltriethoxysilane, N-β-(aminoethyl)-γ-aminopropyltrimethoxysilane, N-β-(aminoethyl)-γ-aminopropylmethylmethoxysilane, N,N-bis(β-hydroxyethyl)-γ-aminopropyltriethoxysilane, and γ-chloropropyltrimethoxysilane. However, it is not limited to these.

Specific examples of the zirconium chelate compound include zirconium butoxide, zirconium ethyl acetoacetate, zirconium triethanolamine, acetylacetonate zirconium butoxide, ethyl acetoacetatezirconium butoxide, zirconium acetate, zirconium oxalate, zirconium lactate, zirconium phosphnate, zirconium octanoate, zirconium naphthenate, zirconium laurate, zirconium stearate, zirconium isostearate, methacrylate zirconium butoxide, stearate zirconium butoxide, and isostearate zirconium butoxide.

Specific examples of the titanium chelate compound include tetraisopropyl titanate, tetranormalbutyl titanate, butyl titanate dimer, tetra(2-ethylhexyl) titanate, titaniumacetylacetonate, polytitaniumacetylacetonate, titanium octylene glycolate, titanium lactate ammonium salt, titanium lactate, titanium lactate ethyl ester, titanium triethanolaminate and polyhydroxytitanium stearate.

Specific examples of the aluminum chelate compound include aluminum isopropylate, monobutoxyaluminum diisopropylate, aluminum butyrate, diethylacetoacetate aluminum diisopropylate and aluminum tris(ethylacetoacetate).

These additives may be used solely, or as a mixture or polycondensate of a plurality of compounds.

Moreover, the abovementioned under coating layer forming coating liquid may contain at least one type of electron accepting material. Specific examples of the electron accepting material include succinic anhydride, maleic anhydride, dibromomaleic anhydride, phthalic anhydride, tetrabromophthalic anhydride, tetracyanoethylene, tetracyanoquinodimethane, o-dinitrobenzene, m-dinitrobenzene, chloranil, dinitroanthraquinone, trinitrofluorenone, picric acid, o-nitrobenzoic acid, p-nitrobenzoic acid, and phthalic acid. Among them, there are particularly preferably used fluorenones, quinines, and benzenes having an electron attractive substituent such as Cl, CN, and $NO_2$. As a result, in the photosensitive layer, the photosensitivity may be improved, the residual charge may be decreased, and the deterioration of photosensitivity when used repeatedly may be reduced. The uneven concentration of the toner image formed by the image forming device comprising the photoreceptor containing an electron accepting material in the under coating layer may be sufficiently prevented.

Moreover, a dispersion type under coating layer coating agent described below may be used instead of the abovementioned under coating layer coating agent. As a result, by appropriately adjusting the resistance of the under coating layer, residual charge may be prevented from being accumulated, and the under coating layer may be made thicker. Therefore, the leak resistance of the photoreceptor may be improved, in particular, leaking at the time of contact electrification may be prevented.

This dispersion type under coating layer coating agent includes: metal powder such as aluminum, copper, nickel, and silver; conductive metal oxide such as antimony oxide, indium oxide, tin oxide, and zinc oxide; and conductive material such as carbon fiber, carbon black, and graphite powder dispersed in a binder resin. As the conductive metal oxide, metal oxide particles having a mean primary particle size of 0.5 μm or less may be used. If the mean primary particle size is too large, conduction paths are often generated locally, readily causing current leaking, which may result in the occurrence of fogging or leaking of large current from the electrification device. The under coating layer is needed to be adjusted to an appropriate resistance in order to improve the leak resistance. Therefore, the abovementioned particles having a mean primary particle size of 0.5 μm or less may have a powder resistance of about $10^2$ Ω·cm or more and $10^{11}$ Ω·cm or less.

If the resistance of the metal oxide particle is lower than the lower limit of the above range, sufficient leak resistance may not be obtained. If it is higher than the upper limit of this range, the residual charge may be increased. Consequently, among them, metal oxide particles such as stannic oxide, titanium oxide, and zinc oxide are preferably used. Moreover, the metal oxide particles may be used in a mixture of a plurality of types thereof. Furthermore, by performing the surface treatment on the metal oxide particles using a coupling agent, the resistance of the powder may be controlled. As the coupling agent that may be used in this case, similar materials as those for the abovementioned under coating layer forming coating liquid can be used. Moreover, these coupling agents may be used in a mixture of a plurality of types thereof.

In this surface treatment of the metal oxide particles, any method can be used as long as publicly known, and either a dry method or wet method may be used.

If a dry method is used, firstly the metal oxide particles are heated and dried, to remove the surface adsorbed water. By removing the surface adsorbed water, the coupling agent may be evenly absorbed on the surface of the metal oxide particles. Next, while stirring the metal oxide particles by a mixer or the like having a large shearing force, the coupling agent, either directly or dissolved in an organic solvent or water, is dropped or sprayed with dry air or nitrogen gas, and thereby the treatment is evenly performed. When the coupling agent is dropped or sprayed, the treatment may be performed at a temperature of 50° C. or more. After adding or spraying the coupling agent, printing may be further performed at a temperature of 100° C. or more. By the effect of the printing, the coupling agent can be cured and a firm chemical reaction with the metal oxide particles can be generated. The printing may be performed at a temperature at which a desired electrophotographic characteristic is obtained, for an optional range of time.

If a wet method is used, similarly to the dry method, firstly the surface adsorbed water on the metal oxide particles is removed. As the method of removing the surface adsorbed water, in addition to the heat and dry method which is similar to the dry method, there may be performed a method of removing by stirring and heating in a solvent used for surface treatment, and a method of removing by azeotroping with a solvent. Next, the metal oxide particles are stirred in a solvent, and dispersed by using ultrasonic waves, a sandmill, an attritor, a ball mill, or the like. The coupling agent solution is added thereinto, and stirred or dispersed. Then, the solvent is removed, and thereby the treatment is evenly performed. After removing the solvent, printing may be further performed at a temperature of 100° C. or more. The printing may be performed at a temperature at which a desired electrophotographic characteristic is obtained, for an optional range of time.

The amount of the surface treatment agent with respect to the metal oxide particles may be an amount by which a desired electrophotographic characteristic is obtained. The electrophotographic characteristic is affected by the amount of the surface treatment agent adhered on the metal oxide particles after surface treatment. In the case of the silane coupling agent, the adhered amount is obtained by the Si intensity measured by fluorescent X-ray spectroscopy (caused by silane coupling agent), and the intensity of the main metal element used in the metal oxide. The Si intensity measured by fluorescent X-ray spectroscopy may be within a range of $1.0 \times 10^{-5}$ times or more and $1.0 \times 10^{-3}$ times or less of the intensity of the main metal element used in the metal oxide. If it is lower than this range, image defects such as blushing may often occur. If it exceeds this range, the concentration may be often decreased due to an increase in the residual charge.

The binding resin contained in the dispersion type under coating layer coating agent include: a publicly known polymeric resin compound such as an acetal resin such as polyvinyl butyral, a polyvinylalcohol resin, casein, a polyamide resin, a cellulose resin, a gelatin, a polyurethane resin, a polyester resin, a methacrylic resin, an acrylic resin, a polyvinylchloride resin, a polyvinyl acetate resin, a vinyl chloride-vinyl acetate-maleic anhydride resin, a silicone resin, a silicone-alkyd resin, a phenol resin, a phenol-formaldehyde resin, a melamine resin, and an urethane resin; a charge transport resin having a charge transport group; and a conductive resin such as polyaniline.

Among them, there is preferably used a resin that is insoluble in a coating solvent of a layer formed on the under coating layer. In particular, a phenol resin, a phenol-formaldehyde resin, a melamine resin, an urethane resin, an epoxy resin, and the like are preferably used. The ratio of the metal oxide particles to the binder resin in the dispersion type under coating layer forming coating liquid can be optionally set within a range by which a desired photoreceptor characteristic is obtained.

The method of dispersing the metal oxide particles that have been surface treated by the above method into the binder resin, include a method using a media disperser such as a ball mill, a vibratory ball mill, an attritor, a sandmill, and a horizontal sandmill, or a medialess disperser such as an agitator, an ultrasonic disperser, a roll mill, and a high pressure homogenizer. Furthermore, the high voltage homogenizer includes a collision method where a dispersing liquid is dispersed by liquid-liquid collision or liquid-wall collision under a high pressure, and a penetration method where a dispersing liquid is dispersed by making it penetrate through minute channels under a high pressure.

The method of forming the under coating layer by this dispersion type under coating layer coating agent can be performed similarly to the method of forming the under coating layer using the abovementioned under coating layer coating agent.

-Photosensitive Layer: Charge Transport Layer-

Next is a description of the photosensitive layer, separately for the charge transport layer and the charge generation layer in this order.

Examples of the charge transport material used for the charge transport layer are as follows. That is, there is used a hole transport material such as: oxadiazoles such as 2,5-bis (p-diethylaminophenyl)-1,3,4-oxadiazole; pyrazolines such as 1,3,5-triphenyl-pyrazoline, and 1-[pyridyl-(2)]-3-(p-diethylaminostyryl)-5-(p-diethylaminostyryl)pyrazoline; an aromatic tertiary amino compound such as triphenylamine, tri(P-methyl)phenylamine, N,N-bis(3,4-dimethylphenyl)biphenyl-4-amine, dibenzylaniline, and 9,9-dimethyl-N,N-di (p-tolyl) fluorenone-2-amine; an aromatic tertiary diamino compound such as N,N'-diphenyl-N,N'-bis(3-methylphenyl)-[1,1-biphenyl]-4,4'-diamine; 1,2,4-triazines such as 3-(4'dimethylaminophenyl)-5,6-di-(4'-methoxyphenyl)-1,2,4-triazine; hydrazones such as 4-diethylaminobenzaldehyde-1,1-diphenylhydrazone, 4-diphenylaminobenzaldehyde-1,1-diphenylhydrazone, [p-(diethylamino)phenyl](1-naphthyl) phenylhydrazone, 1-pyrenediphenylhydrazone, 9-ethyl-3-[(2methyl-1-indolinylimino)methyl]carbazole, 4-(2-methyl-1-indolinyliminomethyl)triphenylamine, 9-methyl-3-carbazolediphenylhydrazone, 1,1-di-(4,4'-methoxyphenyl) acrylaldehydediphenylhydrazone, and β,β-bis (methoxyphenyl) vinyldiphenylhydrazone; quinazolines such as 2-phenyl-4-styryl-quinazoline; benzofurans such as 6-hydroxy-2,3-di(p-methoxyphenyl)-benzofuran; α-stilbenes such as p-(2,2-diphenylvinyl)-N,N-diphenylaniline; enamines; carbazoles such as N-ethylcarbazole; poly-N-vinylcarbazole and the derivatives thereof. Alternatively, it includes a polymer having a group comprising the above compound on the main chain or side chain. These charge transport materials may be used solely or in combination of a plurality of types thereof.

Any binder resin may be used as the binder resin used for the charge transport layer. However, in particular, preferably the binder resin is compatible with the charge transport material and has an appropriate strength.

Examples of this binder resin include: various polycarbonate resins of bisphenol A, bisphenol Z, bisphenol C, bisphenol TP, and the like, and the copolymer thereof; a polyalylate resin and the copolymer thereof; a polyester resin; a methacrylic resin; an acrylic resin; a polyvinylchloride resin; a polyvinylidene chloride resin; a polystyrene resin; a polyvinyl acetate resin; a styrene-butadiene copolymer resin; a vinyl chloride-vinyl acetate copolymer resin; a vinyl chloride-vinyl acetate-maleic anhydride copolymer resin; a silicone resin; a silicone-alkyd resin; a phenol-formaldehyde resin; a styrene-acrylic copolymer resin, an ethylene-alkyd resin; a poly-N-vinylcarbazole resin; a polyvinyl butyral resin; and a polyphenylene ether resin. These resins may be used solely, or as a mixture of a plurality of types thereof.

The molecular weight of the binder resin used for the charge transport layer is suitably selected according to the film forming condition such as the thickness of the photosensitive layer, the solvent, or the like. However, normally, preferably the viscosity-average molecular weight is within a range of 3000 or more and $300 \times 10^3$ or less, and more preferably a range of $20 \times 10^3$ or more and $200 \times 10^3$ or less.

The charge transport layer can be formed by applying and drying a solvent having the charge transport material and the binder resin dissolved in an appropriate solvent. Examples of the solvent used for forming the charge transport layer forming coating liquid include: aromatic hydrocarbons, such as benzene, toluene, and chlorobenzene; ketones such as acetone and 2-butanone; halogenated aliphatic hydrocarbons such as methylene chloride, chloroform, and ethylene chloride; cyclic or linear ethers such as tetrahydrofuran, dioxane, ethylene glycol, diethylether; and mixed solvents thereof. The mix proportion of the charge transport material and the binder resin may be within a range between 10:1 and 1:5. Moreover, generally, the thickness of the charge transport layer is preferably within a range of 5 μm or more and 50 μm or less, and more preferably within a range of 10 μm or more and 40 μm or less.

The charge transport layer and/or the charge generation layer described later may contain additives such as an antioxidant, a photostabilizer, and a thermal stabilizer, in order to prevent the deterioration of the photoreceptor due to ozone or oxidizing gas generated in the image forming device, light, or heat.

The antioxidant includes hindered phenol, hindered amine, paraphenylendiamin, arylalkane, hydroquinone, spirochromans, spiroindanone, or the derivatives thereof, an organic sulfur compound, and an organophosphorus compound.

Specific examples of the compound of the antioxidant include: a phenolic antioxidant such as 2,6-di-t-butyl-4-methylphenol, styrenated phenol, n-octadecyl-3-(3', 5'-di-t-butyl-4'-hydroxyphenyl)-propionate, 2,2'-methylene-bis-(4-methyl-6-t-butylphenol), 2-t-butyl-6-(3'-t-butyl-5'-methyl-2'-hydroxybenzyl)-4-methylphenylacrylate, 4,4'-butylidene-bis-(3-methyl-6-t-butyl-phenol), 4,4'-thio-bis-(3-methyl-6-t-butylphenol), 1,3,5-tris(4-t-butyl-3-hydroxy-2,6-dimethylbenzyl)isocyanurate, tetrakis-[methylene-3-(3',5'-di-t-butyl-4'-hydroxy-phenyl)propionate]-methane, and 3,9-bis[2-[3-(3-t-butyl-4-hydroxy-5-methylphenyl) propionyloxy]-1,1-dimethylethyl]-2,4,8,10-tetraoxaspiro[5,5]undecane, 3-3',5'-di-t-butyl-4'-hydroxyphenyl)stearyl propionate.

The hindered amine compound includes bis(2,2,6,6-tetramethyl-4-piperidyl)sebacate, bis(1,2,2,6,6-pentamethyl-4-piperidyl)sebacate, 1-[2-[3-(3,5-di-t-butyl-4-hydroxyphenyl)propionyloxy]ethyl]-4-[3-(3,5-di-t-butyl-4-hydroxyphenyl)propionyloxy]-2,2,6,6-tetramethylpiperidine, 8-benzyl-7,7,9,9-tetramethyl-3-octyl-1,3,8-triazaspiro[4,5]undecane-2,4-dione, 4-benzoyloxy-2,2,6,6-tetramethylpiperidine, succinic acid dimethyl-1-(2-hydroxyethyl)-4-hydroxy-2,2,6,6-tetramethylpiperidine polycondensate, poly[{6-(1,1,3,3-tetramethylbutyl)imino-1,3,5-triazine-2,4-diimyl}{(2,2,6,6-tetramethyl-4-piperidyl) imino}hexamethylene{(2,3,6,6-tetramethyl-4-piperidyl) imino}], 2-(3,5-di-t-butyl-4-hydroxybenzyl)-2-n-butyl malonic acid bis(1,2,2,6,6-pentamethyl-4-piperidyl), and N,N'-bis(3-aminopropyl) ethylenediamine-2,4-bis[N-butyl-N-(1,2,2,6,6,-pentamethyl-4piperidyl)amino]-6-chloro-1,3,5-triazine condensate.

The organic sulfur antioxidant includes dilauryl-3,3'-thiodipropionate, dimyristyl-3,3'-thiodipropionate, distearyl-3,3'-thiodipropionate, pentaerythritol-tetrakis-(β-lauryl-thiopropionate), ditridecyl-3,3'-thiodipropionate, and 2-mercaptobenzimidazole.

The organophosphorus antioxidant includes trisnonylphenylphosphate, triphenylphosphate, and tris(2,4-di-t-butylphenyl)-phosphate.

The organic sulfur antioxidants and organophosphorus antioxidants are called a secondary antioxidant, which can increase the antioxidative effect synergistically by using with a primary antioxidant such as phenols or amines.

The photostabilizer includes derivatives of for example benzophenones, benzotriazoles, dithiocarbamates, and tetramethylpiperidines.

The benzophenone photostabilizer includes 2-hydroxy-4-methoxybenzophenone, 2-hydroxy-4-octoxybenzophenone, and 2,2'-di-hydroxy-4-methoxybenzophenone.

The benzotriazole photostabilizer includes 2-(–2'-hydroxy-5'methylphenyl-)-benzotriazole, 2-[2'-hydroxy-3'-(3",4",5",6"-tetra-hydrophthalimide-methyl)-5'-methylphenyl]-benzotriazole, 2-(–2'-hydroxy-3'-t-butyl 5'-methylphenyl-)-5-chlorobenzotriazole, 2-(2'-hydroxy-3'-t-butyl-5'-methylphenyl-)-5-chloro benzotriazole, 2-(2'-hydroxy-3',5'-t-butylphenyl-)-benzotriazole, 2-(2'-hydroxy-5'-t-octylphenyl)-benzotriazole, and 2-(2'-hydroxy-3',5'-di-t-amylphenyl-)-benzotriazole.

Other photostabilizers include 2,4, di-t-butylphenyl-3',5'-di-t-butyl-4'-hydroxybenzoate, and nickel dibutyl-dithiocarbamate.

The charge transport layer can be formed by applying and drying a solvent having the charge transport material and the binder resin dissolved in an appropriate solvent. Examples of the solvent used for adjusting the charge transport layer forming coating liquid include: aromatic hydrocarbons, such as benzene, toluene, and chlorobenzene; ketones such as acetone and 2-butanone; halogenated aliphatic hydrocarbons such as methylene chloride, chloroform, and ethylene chloride; cyclic or linear ethers such as tetrahydrofuran, dioxane, ethylene glycol, diethylether; and mixed solvents thereof.

Moreover, the charge transport layer forming coating liquid may added with a small amount of silicone oil as a leveling agent for improving the smoothness of the coating film formed by coating.

The mix proportion of the charge transport material and the binder resin may be within a range between 10:1 and 1:5. Moreover, generally, the thickness of the charge transport layer is preferably within a range of 5 μm or more and 50 μm or less, and more preferably within a range of 10 μm or more and 30 μm or less.

The application of the charge transport layer forming coating liquid can be performed according to the shape and usage of the photoreceptor, by using a method such as a dip coating method, a ring coating method, a spray coating method, a bead coating method, a blade coating method, a roller coating method, a knife coating method, and a curtain coating method. It may be heated and dried after becoming dry to touch at a room temperature. The heating and drying may be performed in a temperature range of 30° C. or more and 200° C. or less, for 5 minutes or more and 2 hours or less.

-Photosensitive Layer: Charge Generation Layer-

The charge generation layer is formed by deposition of a charge generating material by a vacuum deposition method, or coating of a solution containing an organic solvent and a binder resin.

As to the charge generating material, there may be used: amorphous selenium, crystalline selenium, selenium-tellurium alloy, selenium-arsenic alloy, and other selenium compounds; an inorganic photoconductor such as selenium alloy, zinc oxide, and titanium oxide; or a dye-sensitized material thereof, various phthalocyanine compound such as metal-free phthalocyanine, titanyl phthalocyanine, copper phthalocyanine, tin phthalocyanine, and galliumphthalocyanine; various organic pigments such as squaryliums, anthanthrones, perylenes, azos, anthraquinones, pyrenes, pyrylium salt, and thia pyrylium salt; or dyes.

Moreover, these organic pigments generally have several types of crystal forms. In particular, for the phthalocyanine compound, various crystal forms are known such as α type and β type. As long as the pigment provides the sensitivity or other characteristics according to the purpose, any of these crystal forms can be used.

Among the abovementioned charge generating materials, phthalocyanine compounds are preferred. In this case, if light is irradiated on the photosensitive layer, the phthalocyanine compound contained in the photosensitive layer absorbs photons and generates carriers. At this time, since the phthalocyanine compound has a high quantum efficiency, the absorbed photons can be efficiently absorbed to generate carriers.

Furthermore, among the phthalocyanine compound, the phthalocyanine as shown in the following (1) to (3) are more preferred. That is:

(1) Hydroxy gallium phthalocyanine of a crystal form having diffraction peaks at least in the positions of 7.6°, 10.0°, 25.2°, and 28.0° in the Bragg angle (2θ±0.2°) of an X-ray diffraction spectrum using Cuk α rays as a charge generating material.

(2) Chlorogallium phthalocyanine of a crystal form having diffraction peaks at least in the positions of 7.3°, 16.5°, 25.4°, and 28.1° in the Bragg angle (2θ±0.2°) of an X-ray diffraction spectrum using Cuk α ray as a charge generating material.

(3) Titanyl phthalocyanine of a crystal form having diffraction peaks at least in the positions of 9.5°, 24.2°, and 27.3° in the Bragg angle (2θ±0.2°) of an X-ray diffraction spectrum using Cuk α ray as a charge generating material.

These phthalocyanine compounds have not only high photosensitivity in particular, but also high stability of the photosensitivity. Therefore, the photoreceptor having the photosensitive layer containing these phthalocyanine compounds is suitable as a photoreceptor of a color image forming apparatus which requires high speed image formation and repetitive reproducibility.

Due to the crystal shape and the measurement method, these peak intensity and the position may be slightly out from these values. However, as long as the X-ray diffraction pattern is basically matched, it can be judged to be the same crystal form.

Examples of this binder resin used for the charge generation layer include the following. That is, polycarbonate resins such as bisphenol A type and bisphenol Z type, and the copolymer thereof; a polyalylate resin; a polyester resin; a methacrylic resin; an acrylic resin; a polyvinylchloride resin; a polystyrene resin; a polyvinyl acetate resin; a styrene-butadiene copolymer resin; a vinylidene chloride-acrylnitryl copolymer resin; a vinyl chloride-vinyl acetate-maleic anhydride copolymer resin; a silicone resin; a silicone-alkyd resin; a phenol-formaldehyde resin; styrene-alkyd resin; and a poly-N-vinylcarbazole.

These binder resins may be used solely or in combination of a plurality of types thereof. The mix proportion of the charge transport material and the binder resin is desirably within a range between 10:1 and 1:10 by weight. Moreover, generally, the thickness of the charge transport layer is preferably within a range of 0.01 μm or more and 5 μm or less, and more preferably within a range of 0.05 μm or more and 2.0 μm or less.

Moreover, the charge generation layer may contain at least one type of electron accepting material in order to improve the sensitivity, decrease the residual charge, and decrease the fatigue at the time of repetitive usage. Examples of the electron accepting material used for the charge generation layer include succinic anhydride, maleic anhydride, dibromomaleic anhydride, phthalic anhydride, tetrabromophthalic anhydride, tetracyanoethylene, tetracyanoquinodimethane, o-dinitrobenzene, m-dinitrobenzene, chloranil, dinitroanthraquinone, trinitrofluorenone, picric acid, o-nitrobenzoic acid, p-nitrobenzoic acid, and phthalic acid. Among them, there are particularly preferred fluorenones, quinines, and benzenes having an electron attractive substituent such as Cl, CN, and $NO_2$.

As the method of dispersing the charge generating material into a resin, there may be used a method such as a roll mill, a ball mill, a vibratory ball mill, an attritor, a dinomill, a sandmill, and a colloid mill.

The solvent of the coating liquid for forming the charge generation layer includes a publicly known organic solvent for example: an aromatic hydrocarbon solvent, such as toluene and chlorobenzene; an aliphatic alcohol solvent, such as methanol, ethanol, n-propanol, iso-propanol and n-butanol; a ketone solvent such as acetone, cyclohexanone, and 2-butanone; a halogenated aliphatic hydrocarbon solvent such as methylene chloride, chloroform, and ethylene chloride; a cyclic or linear ether solvent such as tetrahydrofuran, dioxane, ethylene glycol, diethylether; and an ester solvent such as methyl acetate, ethyl acetate, and n-butyl acetate.

These solvents may be used solely or as a mixture of a plurality of types. If a plurality of types of solvents are mixed, any solvent may be used as long as a binder resin can be dissolved therein as a mixed solvent. However, if the photosensitive layer has a layer structure where the charge transport layer and the charge generation layer are formed in this order from the conductive base substance side, when the charge generation layer is formed using an application such as dip coating in which the lower layer is readily dissolved, a solvent which does not dissolve the lower layer such as the charge transport layer is desirably used. Moreover, when the charge generation layer is formed using a spray coating method or a ring coating method, in which the lower layer is eroded relatively less, the solvent can be widely selected.

-Intermediate Layer-

As to the intermediate layer, for example when the photoreceptor surface is electrified by an electrification device, in order to prevent a situation where the electrification potential can not be obtained by injecting the electrification charges from the photoreceptor surface to the conductive base substance of the photoreceptor serving as the opposed electrode, a charge injection blocking layer may be formed as required between the surface protective layer and the charge generation layer.

As to the material of the charge injection blocking layer, there may be used the abovementioned silane coupling agent, titanium coupling agent, organic zirconium compound, and organic titanium compound, other organometallic compounds, and a widely-used resin such as polyester, and polyvinyl butyral. The thickness of the charge injection blocking layer is appropriately set by considering the film forming property and the carrier blocking property, within a range between about 0.001 µm or more and 5 µm or less.

(Process Cartridge and Image Forming Device)

Next is a description of the process cartridge and the image forming device using the photoreceptor of an exemplary embodiment of the present invention.

The process cartridge of an exemplary embodiment of the present invention is not specifically limited if the photoreceptor of an exemplary embodiment of the present invention is used. However, specifically, it may be a process cartridge integrally having the photoreceptor of an exemplary embodiment of the present invention and any one selected from the group consisting of an electrification device, a development device, a cleaning device, and an electricity removing device, and being detachable from the image forming device main body.

Moreover, the image forming device of an exemplary embodiment of the present invention is not specifically limited if the photoreceptor of an exemplary embodiment of the present invention is used. However, specifically, it may include the photoreceptor of an exemplary embodiment of the present invention, an electrification device that electrifies this photoreceptor surface, an exposure device that exposes the photoreceptor surface electrified by the electrification device to form an electrostatic latent image, a development device that develops the electrostatic latent image by a developer containing a toner to form a toner image, and a transfer device that transfers the toner image onto a recording media. The image forming device of an exemplary embodiment of the present invention may be a so-called tandem device which has a plurality of photoreceptors corresponding to toners of respective colors. In this case, all photoreceptors may be the photoreceptor of an exemplary embodiment of the present invention. Moreover, the toner image may be transferred by the intermediate transfer method using an intermediate transfer body.

The cleaning device of the process cartridge of an exemplary embodiment of the present invention and the cleaning device of the photoreceptor of the image forming device are not specifically limited. However, the cleaning device may be a cleaning blade. Compared to other cleaning devices, the cleaning blade often blemishes the photoreceptor surface and accelerates the wearing. However, since the process cartridge of an exemplary embodiment of the present invention and the image forming device of an exemplary embodiment of the present invention use the photoreceptor of an exemplary embodiment of the present invention as the photoreceptor, blemishes and wearing on the photoreceptor surface may be suppressed even for long term usage.

Next, the image forming device will be described with reference to a drawing.

Figure 6:
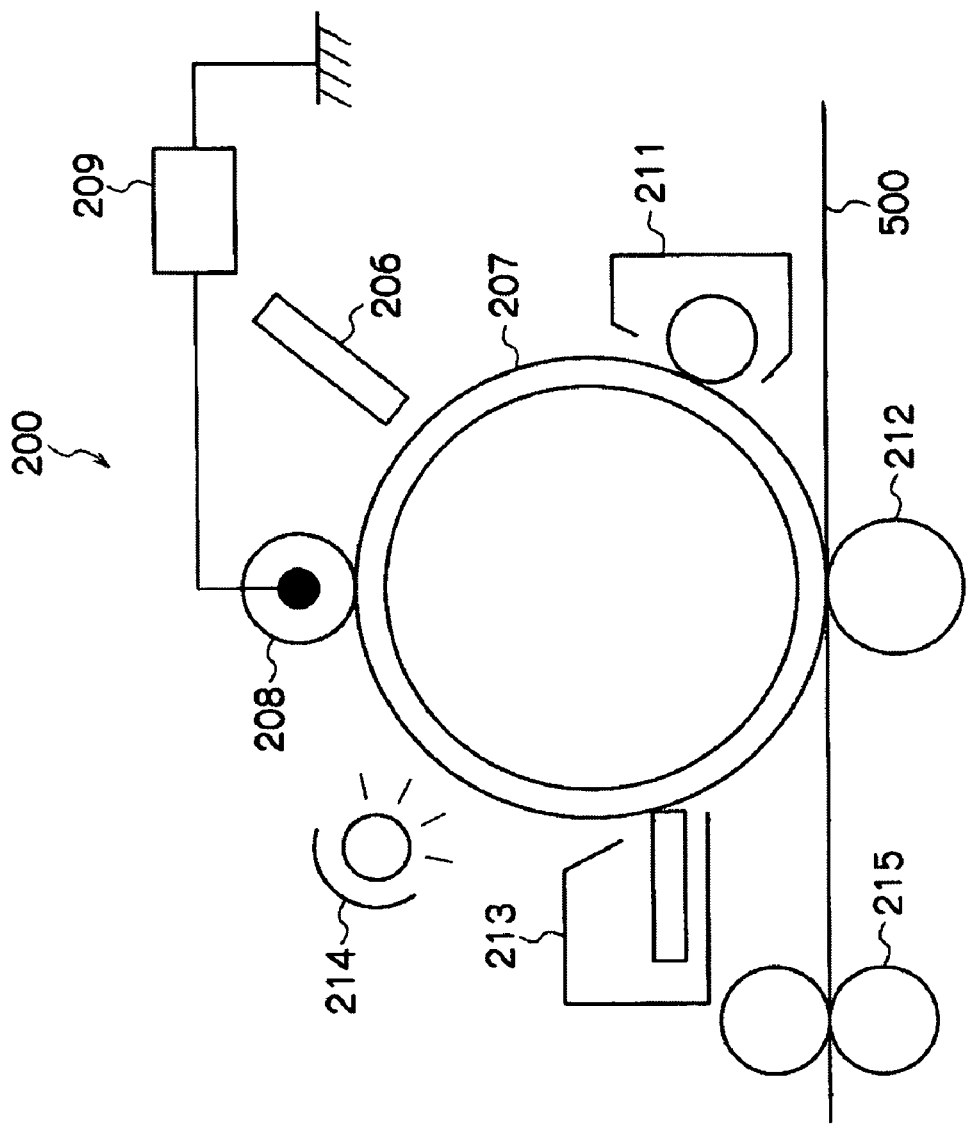
FIG. 6 is a schematic cross-section showing a basic structure of an image forming device of an exemplary of embodiment of the present invention.

FIG. 6 is a schematic cross-section showing a basic structure of an image forming device of an exemplary of embodiment of the present invention. The image forming device 200 shown in FIG. 6 includes a photoreceptor 207, an electrification device 208 that electrifies the photoreceptor 207, a power source 209 that is connected to the electrification device 208, an exposure device 206 that exposes the photoreceptor 207 electrified by the electrification device 208 to form an electrostatic latent image, a development device 211 that develops the electrostatic latent image formed by the exposure device 206 by a toner to form a toner image, a transfer device 212 that transfers the toner image formed by the development device 211 onto a transfer body (image output medium) 500, a cleaning device 213, an electricity removing device 214, and a fixing device 215. In this case, the electricity removing device 214 may not be included in the image forming device.

Figure 7:
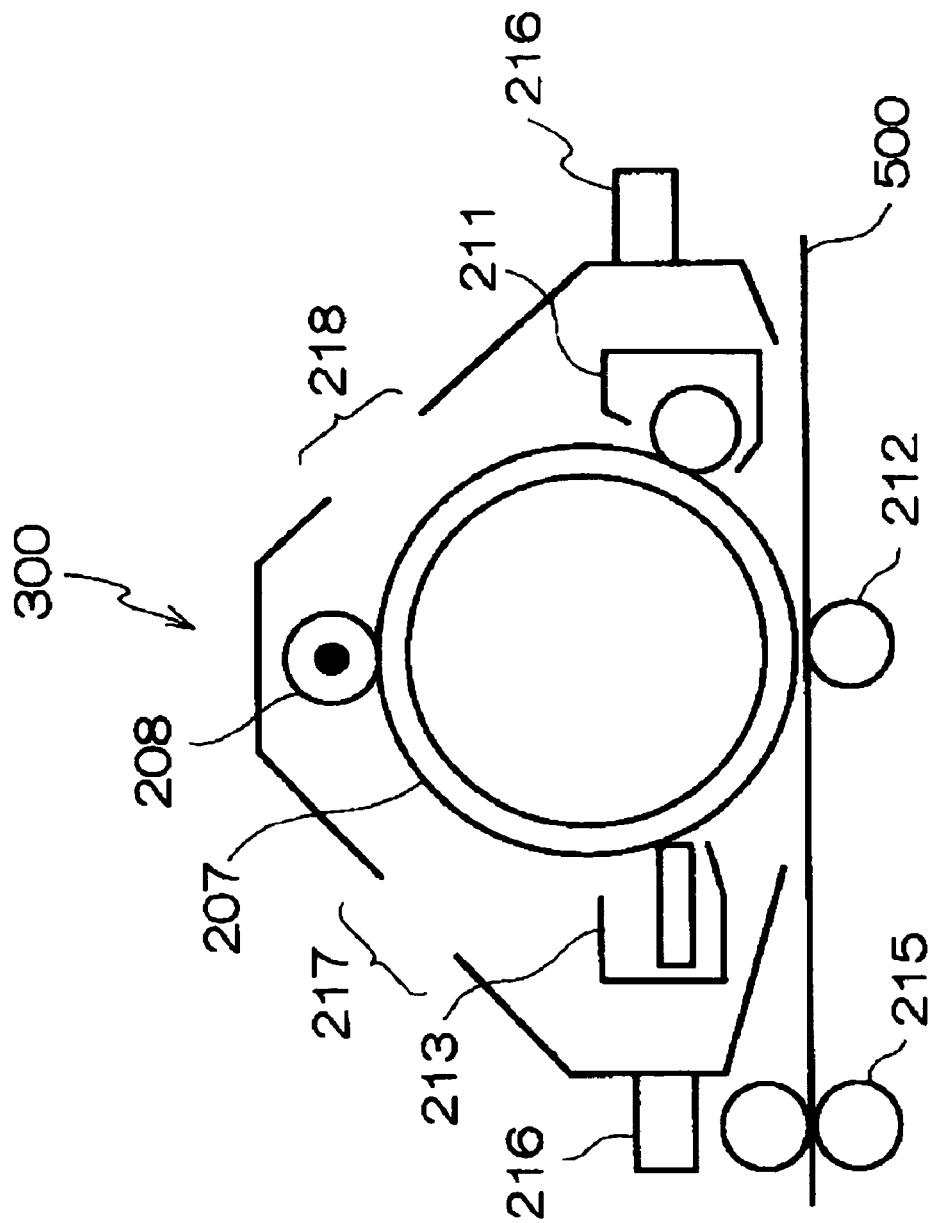
FIG. 7 is a schematic cross-section showing an example of a process cartridge of an exemplary embodiment of the present invention.

FIG. 7 is a schematic cross-section showing an example of a process cartridge of an exemplary embodiment of the present invention. In the process cartridge 300, a photoreceptor 207, an electrification device 208, a development device 211, a cleaning device (cleaning means) 213, an opening 218 for exposure, and an opening 217 for electricity removing are combined by using a fixing rail 216, and integrated. The development device 211 supplies the photoreceptor 207 with a toner.

The process cartridge 300 is detachable from the image forming device main body including a transfer device 212, a fixing device 215, and other component parts which are not shown, and may be included in the image forming device together with the image forming device main body.

In FIGS. 6 and 7, the photoreceptor 207 is the photoreceptor of an exemplary embodiment of the present invention.

(Method of Manufacturing Semiconductor Film)

Next is a description of a method of manufacturing the semiconductor film of an exemplary embodiment of the present invention. For the semiconductor film of an exemplary embodiment of the present invention, there may be used a publicly known vapor phase film-formation method, such as plasma CVD (Chemical Vapor Deposition) method, the organic metal vapor deposition method, the molecular-beam epitaxy method, vacuum evaporation, and sputtering. However, the organic metal vapor deposition method is preferably used.

In this case, it may be such that, by an activation device which activates a nitrogen containing substance and an oxygen containing substance into an energy state or an excited state required for reaction, the nitrogen containing substance and the oxygen containing substance are made into active species, and then the active species and an organometallic compound containing an inactivated group 13 element are reacted, so as to form the semiconductor film of an exemplary embodiment of the present invention on the base material.

As a result, even if the base material contains an organic material, for example if a polymeric film substrate is used as the conductive base substance of the light receiving element, or if the photoreceptor is an organic photoreceptor, without thermally damaging the conductive base substance and the photosensitive layer, the semiconductor film having the abovementioned characteristics can be formed as the photoconductive layer of the light receiving element or the surface layer of the photoreceptor. For the formation of the semiconductor film, the surface of the base material may be previously cleaned by plasma.

The formation of the semiconductor film described above is normally performed by supplying gases including a nitrogen containing substance and oxygen containing substance, and an organometallic compound containing a group 13 element, or the evaporated gas thereof in a reaction chamber (film formation chamber) arranged with the base material, while exhausting the reacted gas from the reaction chamber. From such a viewpoint, the organometallic compound containing a group 13 element may be introduced on the downstream from the activation device which activates the nitrogen containing substance and oxygen containing substance.

As a result, the nitrogen containing substance and oxygen containing substance activated on the upstream from the position where the organometallic compound containing a group 13 element has been introduced, is merged on the downstream from the activation device. Therefore, the inactivated organometallic compound containing a group 13 element and the activated nitrogen containing substance and oxygen containing substance may be reacted.

Moreover, according to the usage of the semiconductor film of an exemplary embodiment of the present invention, if the base material contains an organic material, for example a PET film with an ITO electrode is used as the conductive base substance of the light receiving element, or if the photosensitive layer of the photoreceptor contains an organic material such as an organic charge generating material or a binder resin, the maximum temperature on the surface of the base material when the semiconductor film is formed on the base material is preferably 100° C. or less, and more preferably 50° C. or less. The maximum temperature on the surface of the base material is preferably close to room temperature. If it exceeds 100° C., the base material may be deformed, or the physical characteristics may be deteriorated due to decomposition of the organic material contained in the base material.

Hereunder is a more detailed description of the method of manufacturing the semiconductor film of an exemplary embodiment of the present invention described above, using an example of a case where the surface layer of the photoreceptor is formed. In the description below, if the conductive base substance is used instead of the photoreceptor in which up to the part of the photosensitive layer is formed, as the base material, the light receiving element can be also formed in the same manner.

Figure 4A:
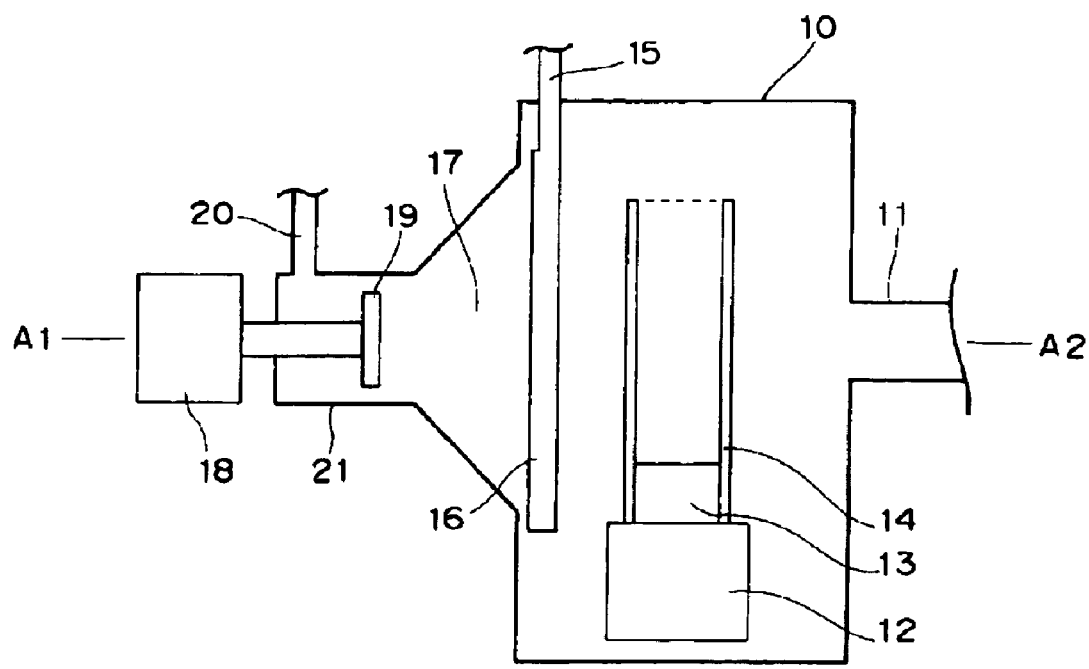
FIG. 4A and FIG. 4B are schematic diagrams showing an example of a film-forming apparatus used for forming the surface layer of the photoreceptor of an exemplary embodiment of the present invention.
Figure 4B:
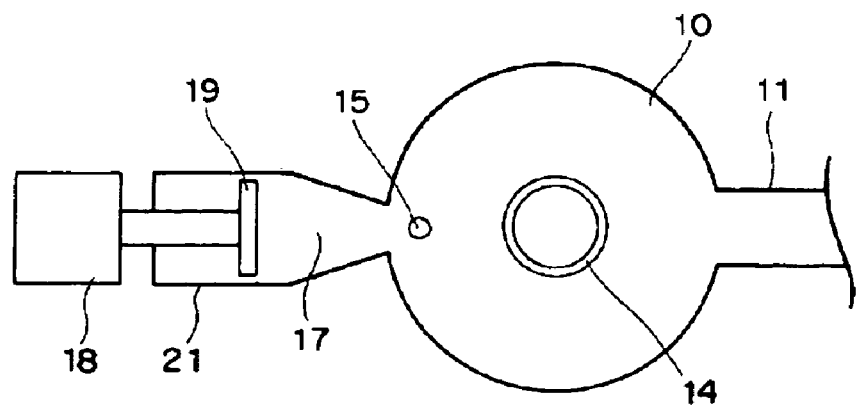

FIG. 4A and FIG. 4B are schematic diagrams showing an example of a film-forming apparatus used for forming the surface layer of the photoreceptor of an exemplary embodiment of the present invention, wherein FIG. 4A is a schematic cross-section of the film-forming apparatus viewed from the side, and FIG. 4B is a schematic cross-section between A1-A2 of the film-forming apparatus shown in FIG. 4A. In FIG. 4A and FIG. 4B, 10 denotes a film formation chamber, 11 denotes an outlet, 12 denotes a base substance rotation section, 13 denotes a base substance holder, 14 denotes a base substance, 15 denotes a gas introduction pipe, 16 denotes a shower nozzle, 17 denotes a plasma diffusion portion, 18 denotes a high frequency power supply section, 19 denotes a plate electrode, 20 denotes a gas introduction pipe, and 21 denotes a high frequency discharge pipe portion.

In the film-forming apparatus shown in FIG. 4A and FIG. 4B, one end of the film formation chamber 10 is provided with the outlet 11 connected to a vacuum exhauster (not shown), and the opposite side of the film formation chamber 10 to where the outlet 11 is provided is provided with a plasma-generating device including the high frequency power supply section 18, the plate electrode 19, and the high frequency discharge pipe portion 21.

This plasma-generating device includes the high frequency discharge pipe portion 21, the plate electrode 19 which is arranged in the high frequency discharge pipe portion 21 and has the discharge face provided on the outlet 11 side, and the high frequency power supply section 18 which is arranged outside of the high frequency discharge pipe portion 21 and is connected to the opposite face to the discharge face of the plate electrode 19. The high frequency discharge pipe portion 21 is connected with the gas introduction pipe 20 for supplying a gas into the high frequency discharge pipe portion 21. The opposite end of this gas introduction pipe 20 is connected with a first gas supply source (not shown).

Figure 5:
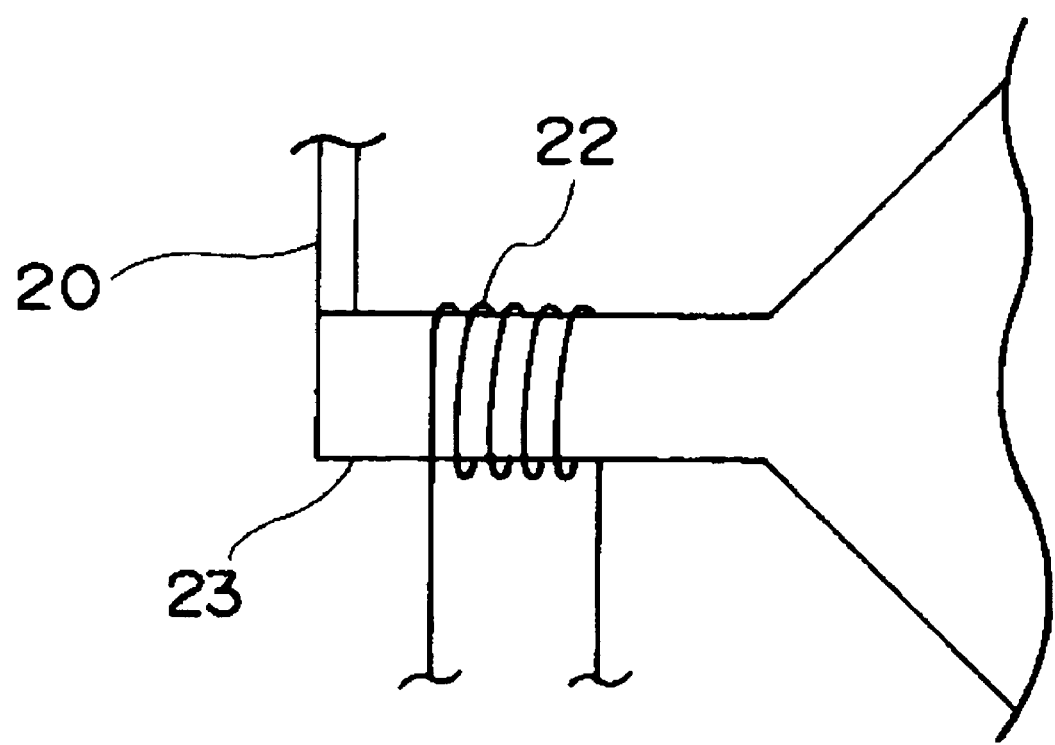
FIG. 5 is a schematic diagram showing another example of a plasma-generating apparatus that can be used in the film-forming apparatus shown in FIG. 4A and FIG. 4B.

Instead of the plasma-generating device provided in the film-forming apparatus shown in FIG. 4A and FIG. 4B, a plasma-generating device shown in FIG. 5 may be used. FIG. 5 is a schematic diagram showing another example of the plasma-generating device that can be used in the film-forming apparatus shown in FIG. 4A and FIG. 4B, and a side view of the plasma-generating device. In FIG. 5, 22 denotes a high frequency coil, 23 denotes a silica tube, and 20 is the same pipe as the one shown in FIG. 4A and FIG. 4B. This plasma-generating device comprises a silica tube 23, and a high frequency coil 22 provided along the peripheral face of the silica tube 23. One end of the silica tube 23 is connected with the film formation chamber 10 (not shown in FIG. 5). Moreover, the other end of the silica tube 23 is connected with the gas introduction pipe 20 for introducing a gas into the silica tube 23.

The discharge face side of the plate electrode 19 is connected with a rod-shaped shower nozzle 16 which is approximately in parallel with the discharge face. The other end of the shower nozzle 16 is connected with the gas introduction pipe 15. This gas introduction pipe 15 is connected with a second gas supply source (not shown) provided out of the film formation chamber 10.

Moreover, in the film formation chamber 10 is provided a base substance rotation section 12, so that a cylindrical base substance 14 can be attached to the base substance rotation section 12 via the base substance holder 13 so as to face the longitudinal direction of the shower nozzle and the axial direction of the base substance 14 approximately in parallel. For forming the film, the base substance 14 can be rotated in the circumferential direction by rotation of the base substance rotation section 12. As to the base substance 14, there is used a photoreceptor which is previously laminated to the photosensitive layer, or a photoreceptor which is laminated to the intermediate layer on the photosensitive layer.

If a light receiving element is formed by means of an apparatus shown in FIG. 4A and FIG. 4B, instead of the base substance holder 13 which fixes the cylindrical base substance 14, a base substance holder such as a conductive base substance which fixes a plate like substrate may be attached, or the conductive base substance may be adhered onto the peripheral face of the base substance 14 attached to the base substance holder 13, to form the semiconductor film while rotating the base substance holder 13.

The surface layer may be formed as follows, for example. Firstly, an $N_2$ gas, an $H_2$ gas, a He gas, and an oxygen gas are introduced from the gas introduction pipe 20 into the high frequency discharge pipe 21, and radio waves of 13.56 MHz are supplied from the high frequency power supply section 18 to the plate electrode 19. At this time, the plasma diffusion portion 17 is formed so as to be radially spread from the discharge face side of the plate electrode 19 to the outlet 11 side. Here, four types of gases introduced from the gas introduction pipe 20 flow through the film formation chamber 10 from the plate electrode 19 side to the outlet 11 side. The plate electrode 19 may have the electrode surrounded by an earth shield.

Next, by introducing a trimethylgallium gas that has been diluted using hydrogen as a carrier gas into the film formation chamber 10 through the gas introduction pipe 15 and the shower nozzle 16 positioned on the downstream from the plate electrode 19 serving as the activation device, a non-single crystal film containing nitrogen and oxygen can be formed on the surface of the base substance 14.

The temperature for forming the surface layer is not specifically limited. However, if an amorphous silicon photoreceptor is formed, the temperature of the surface of the cylindrical base substance 14 may be within a range between 50° C. and 350° C. If an organic photoreceptor is formed, the temperature of the surface of the cylindrical base substance 14 may be within a range between 20° C. and 100° C.

If an organic photoreceptor is formed, the temperature of the surface of the base substance 14 at the time for forming the surface layer is preferably 100° C. or less, more preferably 80° C. or less, and particularly preferably 50° C. or less. Even if the temperature of the surface of the base substance 14 is 100° C. or less at the beginning of the film formation, when it exceeds 150° C. due to the effect of plasma, the photosensitive layer may be damaged by heat. Therefore, the temperature of the surface of the base substance 14 may be controlled considering such an effect.

The temperature of the surface of the base substance 14 may be controlled by a heating and/or cooling device (not shown in the drawing), or may be left to a natural temperature increase at the time of discharge. If the base substance 14 is heated, the heater may be set inside or outside of the base substance 14. If the base substance 14 is cooled down, a cooling gas or liquid may be circulated inside the base substance 14.

If the temperature increase of the surface of the base substance 14 due to discharge is to be avoided, it is effective to control the high energy gas flow in contact with the surface of the base substance 14. In this case, conditions such as gas flow, discharge output, and pressure are adjusted for a necessary temperature.

As to the gas containing the group 13 element, instead of trimethylgallium gas, organometallic compounds containing indium or aluminum or hydrides such as diborane may be used. Multiple types thereof may be mixed.

For example, at the beginning of the film formation, if a film containing nitrogen and indium is formed on the base substance 14 by introducing trimethylindium into the film formation chamber 10 through the gas introduction pipe 15 and the shower nozzle 16, this film can absorb ultraviolet rays which are generated if the film is continuously formed, and which deteriorate the photosensitive layer. As a result, damage to the photosensitive layer due to the generation of ultraviolet rays at the time of film formation can be suppressed.

Moreover, the surface layer may be added with a dopant in order to control its conduction type. As to the method of doping at the time of film formation, there may be used $SiH_3$ and $SnH_4$ for n-type, and biscyclopentadienylmagnesium, dimethylcalcium, dimethylstrontium, dimethylzinc, and diethylzinc for p-type in gas state. Moreover, in order to dope a dopant element in the surface layer, there may be employed a publicly known method such as a thermal diffusion method and an ion implantation method.

Specifically, by introducing a gas containing at least one dopant element into the film formation chamber 10 through the gas introduction pipe 15 and the shower nozzle 16, a surface layer of any conduction type such as n-type and p-type can be obtained.

If the surface layer mainly containing a group 13 atom, a nitrogen atom, and oxygen is formed using an organometallic compound containing a hydrogen atom as a supplying material of the group 13 atom, an active hydrogen may be present in the film formation chamber 10. The active hydrogen may be supplied from a hydrogen atom contained in a hydrogen gas or an organometallic compound used as a carrier gas.

For example, in the film-forming apparatus as shown in FIG. 4A and FIG. 4B, if a hydrogen gas and a nitrogen gas are introduced into the film-forming apparatus from separate positions, a plurality of plasma-generating devices may be provided so that the activated state of the hydrogen gas and the activated state of the nitrogen gas can be independently controlled. Moreover, with respect to this, from the point of simplifying the device, there may be used a gas such as $NH_3$ which contains both of a nitrogen atom and a hydrogen atom as a supplying material of hydrogen and nitrogen, or a gas having nitrogen gas and hydrogen gas mixed, so as to activate it by plasma.

Moreover, if a rare gas such as helium, and hydrogen are used in combination as a carrier gas, due to the etching effect of a film growing on the surface of the base substance 14 by the rare gas such as helium and the hydrogen, an amorphous compound of a group 13 element, nitrogen, and oxygen can be formed even at a low temperature of 100° C. or less, with as little hydrogen as that for growing at a high temperature.

By means of the abovementioned method, the activated hydrogen, nitrogen, oxygen, rare gas, and group 13 atom are present in the vicinity of the surface of the base substance 14, and furthermore the activated rare gas and the hydrogen has an effect of releasing hydrogen of a hydrocarbon group such as a methyl group and an ethyl group included in the organometallic compound, as a molecule. As a result, on the surface of the base substance 14 is formed a surface layer of a hard film containing less hydrogen, where nitrogen, oxygen, and the group 13 element constitute a three dimensional bonding, at a low temperature.

Differing from carbon atoms of sp2 bond type contained in a silicone carbide, such a hard film becomes transparent since Ga and N forms sp3 bonds such as carbon atoms constituting a diamond. Furthermore, this film is transparent and hard, and the surface of the film is water repellant with low friction.

In the plasma-generating device of the film-forming apparatus shown in FIG. 4A and FIG. 4B, a high frequency oscillator is used. However, it is not limited to this. For example, there may be used a microwave oscillator, and a device of an electrocyclotron resonance type or helicon plasma type. Moreover, in the case where a high frequency oscillator is used, it may be either an inductive or capacitive type.

Furthermore, these devices may be used in combination of a plurality of types thereof, or a plural number of the same type. The high frequency oscillator is preferred so as not to increase the temperature of the surface of the base substance 14 due to plasma irradiation, however there may be provided a device which prevents the heat irradiation.

If a plurality different types of plasma-generating devices are used, it is necessary that discharges occur at the same pressure at the same time. Moreover, between the discharge area and the film formation area (portion where the base substance is set) may be provided a pressure difference. These devices may be arranged in series with respect to a gas flow formed in the film-forming apparatus, from a portion into which the gas is introduced, to a portion from which it is discharged. Or, all devices may be arranged so as to face a film formation surface of the base substance.

For example, if two types of plasma-generating devices are arranged in series with respect to the gas flow, using the film-forming apparatus shown in FIG. 4A and FIG. 4B as an example, it may be used as a second plasma-generating device which discharges electricity in the film formation chamber 10 using the shower nozzle 16 as the electrode. In this case, a high frequency voltage can be applied to the shower nozzle 16 through the gas introduction pipe 15, so as to discharge electricity in the film formation chamber 10 using the shower nozzle 16 as the electrode.

Alternatively, instead of using the shower nozzle 16 as the electrode, between the base substance 14 in the film formation chamber 10 and the plasma generating area 19 may be provided a cylindrical electrode, so as to discharge electricity in the film formation chamber 10 using this cylindrical electrode.

Moreover, if two different types of plasma-generating devices are used under the same pressure, for example if a microwave oscillator and a high frequency oscillator are used, the excitation energy of the excited species can be greatly changed, which is effective for controlling the film quality. Furthermore, electricity may be discharged in the vicinity of the atmosphere. If electricity is discharged in the vicinity of the atmosphere, He is desirably used as a carrier gas.

For forming the surface layer, other than the abovementioned methods, there may be used a normal organic metal vapor deposition method and molecular-beam epitaxy method. However, even for film formation by these methods, usage of active nitrogen and/or active hydrogen, and active oxygen is effective for lowering the temperature. In this case, as to the nitrogen material, there may be used a gas such as $N_2$, $NH_3$, $NF_3$, $N_2H_4$, and methyl hydrazine, or vaporized liquid or liquid bubbled by a carrier gas.

EXAMPLES

Hereunder is a specific description of an exemplary embodiment of the present invention with reference to Examples. However, the present invention is not limited to these Examples.

<<Light Receiving Element>>

Example A1

As the conductive base substance, there is used a PET film wherein an ITO film of a thickness of 0.2 μm is formed on one side of a PET film (made by Toray, LUMILAR) of a thickness of 50 μm. The semiconductor layer is formed on the base substance using the film-forming apparatus having the structure shown in FIG. 4A and FIG. 4B.

A cylindrical Al pipe is mounted on the base substance holder 13 in the film formation chamber 10 of the film-forming device, and the surface of this Al pipe is adhered with the PET film so that the face formed with ITO becomes the outer circumferential face side, by an adhesive tape.

Next, inside of the film formation chamber 10 is evacuated through the outlet 11 until the pressure becomes about 0.1 Pa. Next, about 450 sccm of a gas mixed with a nitrogen gas, a He gas, a hydrogen gas, and an oxygen gas (nitrogen gas 100 sccm, hydrogen gas 200 sccm, He gas 150 sccm, and oxygen gas 0.3 sccm) is introduced from the gas introduction pipe 20 into the high frequency discharge pipe portion 21 provided with the electrode 19 having the diameter of 50 mm, and electricity is discharged by setting radio waves of 13.56 MHz to an output of 80 W and matching by a tuner using the high frequency power supply section 18 and a matching circuit (not shown in FIG. 1). The reflected wave at this time is 0 W.

Next, a mixed gas containing a trimethylgallium gas having a hydrogen gas as a carrier gas is introduced through the gas introduction pipe 15 from the shower nozzle 16 into the plasma diffusion portion 17 in the film formation chamber 10 so that the flow rate of the trimethylgallium gas is 3 sccm. At this time, the reaction pressure in the film formation chamber 10 measured by a Baratron vacuum gauge is 40 Pa.

By forming a film for 40 minutes while rotating the Al pipe at 1 rpm, a GaON film containing hydrogen having a thickness of 0.15 μm is formed on the PET film. No heat is applied for forming the film. Moreover, the color of the thermo tape adhered on the Al pipe is confirmed after the film formation, to be 40° C.

-Analysis/Evaluation of Semiconductor Layer-

When forming a film on the PET film, the infrared absorption spectrum of a sample film that has been formed at the same time on the Si substrate fixed to the Al pipe, is measured, and small peaks caused by the Ga—H bond, Ga—N bond, and N—H bond are confirmed. From these, it is found that the surface layer contains gallium, nitrogen, and hydrogen. Furthermore, strong peaks considered as GaN and GaO are observed.

The diffraction figure obtained by RHEED (reflection high energy electron diffraction) measurement shows a halo pattern only, showing that the film is an amorphous film.

The composition of the sample film formed on the Si substrate is measured using Rutherford Back Scattering and Hydrogen Forward Scattering. The results show that gallium, nitrogen, oxygen, and hydrogen are respectively 31, 6, 47, 16 atomic %. Moreover, oxygen is distributed on the whole film, and no carbon is detected. These results show that the film (photoconductive layer) formed on the PET film is an amorphous film containing hydrogen.

-Evaluation-

Next, a circular Au electrode having a size of 3 mm is deposited on the photoconductive layer that has been formed on the PET formed with this ITO film, so that the thickness is 0.1 μm, to produce the light receiving element. Following this, a terminal wire is attached to the ITO electrode and the Au electrode using a silver paste. Next, the UV sensitivity of this light receiving element is measured.

A 100 W Xe lamp having light separated into spectra is used as a light source. The wavelength of the Xe lamp is 360 nm. A digital ammeter (trade name: R8240, made by ADVANTEST) is directly connected, and light is irradiated from the PET film side of the light receiving element so as to correspond with the area provided with the Au electrode of the light receiving element. The distance between the light receiving element and the Xe lamp at the time of irradiation is about 10 cm.

The dark current (unirradiated) at this time is $1 \times 10^{-10}$ A. Moreover, when a UV light (Xe lamp light) is irradiated, an electromotive current of $1 \times 10^{-10}$ A flows. On the other hand, comparison is performed using a UV sensor utilizing polycrystalline gallium nitride as a photoconductive layer used for a commercially available UV meter (trade name: UV CAREMATE, made by Fuji Xerox Co., Ltd.), showing that the output is $1.5 \times 10^{-6}$ A and almost equivalent. Moreover, the light receiving element is exposed to visible light in the room, however it is not specifically reacted. The above results show that this element functions as a UV light receiving element.

Moreover, after forming the light receiving element, it is left in the atmosphere for 6 months, and then the same evaluation is performed. Similar results are obtained and no deterioration in the performance is found. Furthermore, after 6 months, the IR spectrum of the sample film is measured, and no change is found.

Example A2

A light receiving element using the same conductive base substance and the same film-forming apparatus as those of Example A1, and having a magnesium doped semiconductor film formed as a photoconductive layer is produced as follows.

First, inside of the film formation chamber 10 is evacuated until the pressure becomes about 0.1 Pa. Next, about 500 sccm of a gas mixed with a nitrogen gas, a He gas, a hydrogen gas, and an oxygen gas (nitrogen gas 100 sccm, hydrogen gas 200 sccm, He gas 200 sccm, and oxygen gas 0.3 sccm) is introduced from the gas introduction pipe 20 into the high frequency discharge pipe portion 21 provided with the electrode 19 having the diameter of 50 mm, and electricity is discharged by setting radio waves of 13.56 MHz to an output of 80 W and matching by a tuner using the high frequency power supply section 18 and a matching circuit (not shown in FIG. 1). The reflected wave at this time is 0 W.

Next, 3 sccm of a mixed gas containing a trimethylgallium gas having a hydrogen gas as a carrier gas, and 3 sccm of a mixed gas having bispentadienyl magnesium heated to 50° C. to have hydrogen as a carrier gas are introduced. At this time, the reaction pressure in the film formation chamber 10 measured by a Baratron vacuum gauge is 40 Pa.

By forming a film for 60 minutes while rotating the Al pipe at 2 rpm, a Mg doped GaO film having a thickness of 0.15 μm is formed. No heat is applied for forming the film. Moreover, the color of the thermo tape adhered on the Al pipe is confirmed after the film formation, to be 40° C.

-Analysis/Evaluation of Semiconductor Layer-

When forming a film on the PET film, the infrared absorption spectrum of a sample film that has been formed at the same time on the Si substrate fixed to the Al pipe, is measured, and small peaks caused by the GA-H bond, Ga—N bond, and N—H bond are confirmed. From these, it is found that the surface layer contains gallium, nitrogen, and hydrogen. Furthermore, strong peaks considered as GaN and GaO are observed.

The diffraction figure obtained by RHEED (reflection high energy electron diffraction) measurement shows a halo pattern only, showing that the film is an amorphous film.

The composition of the sample film formed on the Si substrate is measured using Rutherford Back Scattering and Hydrogen Forward Scattering. The results show that gallium, nitrogen, oxygen, and hydrogen are respectively 30, 5, 47, 14 atomic %, and magnesium is 4 atomic %. Moreover, oxygen is distributed on the whole layer, and no carbon is detected.

These results show that in the film (photoconductive layer) formed on the PET film, the formed surface layer is an amorphous film, having the composition including oxygen, nitrogen, and gallium, and doped with magnesium.

-Evaluation-

Next, a light receiving element is produced and the photoelectric current is measured in the same manner as that of Example A1.

The dark current at this time is $1 \times 10^{-12}$ A. Moreover, when a UV light is irradiated, an electromotive current of $2 \times 10^{-6}$ A flows. On the other hand, comparison is performed using a UV sensor utilizing polycrystalline gallium nitride as a photoconductive layer used for a commercially available UV meter (tradename: UV CAREMATE, made by Fuji Xerox Co., Ltd.), showing that the output is $1.5 \times 10^{-6}$ A and almost equivalent. Moreover, the light receiving element is exposed to visible light in the room, however it is not specifically reacted. The above results show that this element functions as a UV light receiving element.

Moreover, after forming the light receiving element, it is left in the atmosphere for 6 months, and then the same evaluation is performed. Similar results are obtained and no deterioration in the performance is found. Furthermore, after 6 months, the IR spectrum of the sample is measured, and no change is found.

Example A3

A light receiving element using the same conductive base substance and the same film-forming apparatus as those of Example A1, and having a semiconductor film formed as a photoconductive layer is produced as follows.

First, inside of the film formation chamber 10 is evacuated until the pressure becomes about 0.1 Pa. Next, about 500 sccm of a gas mixed with a nitrogen gas, a He gas, a hydrogen gas, and an oxygen gas (nitrogen gas 200 sccm, He gas 200 sccm, hydrogen gas 100 sccm, and oxygen gas 0.02 sccm) is introduced from the gas introduction pipe 20 into the high frequency discharge pipe portion 21 provided with the electrode 19 having the diameter of 50 mm, and electricity is discharged by setting radio waves of 13.56 MHz to an output of 80 W and matching by a tuner using the high frequency power supply section 18 and a matching circuit (not shown in FIG. 1). The reflected wave at this time is 0 W.

Next, 3 sccm of a mixed gas containing a trimethylgallium gas having a hydrogen gas as a carrier gas is introduced. At this time, the reaction pressure in the film formation chamber 10 measured by a Baratron vacuum gauge is 40 Pa.

By forming a film for 40 minutes while rotating the Al pipe at 1 rpm, a GaON film containing hydrogen having a thickness of 0.15 μm is formed on the PET film. No heat is applied for forming the film. Moreover, the color of the thermo tape adhered on the Al pipe is confirmed after the film formation, to be 40° C.

-Analysis/Evaluation of Semiconductor Layer-

When forming a film on the PET film, the infrared absorption spectrum of a sample film that has been formed at the same time on the Si substrate fixed to the Al pipe, is measured, and small peaks caused by the GA-H bond, Ga—N bond, and N—H bond are confirmed. From these, it is found that the surface layer contains gallium, nitrogen, and hydrogen. Furthermore, strong peaks considered as GaN and GaO are observed.

The diffraction figure obtained by RHEED (reflection high energy electron diffraction) measurement shows a halo pattern only, showing that the film is an amorphous film.

The composition of the sample film formed on the Si substrate is measured using Rutherford Back Scattering and Hydrogen Forward Scattering. The results show that gallium, nitrogen, oxygen, and hydrogen are respectively 31, 25, 17, 27 atomic %. Moreover, oxygen is distributed on the whole film, and no carbon is detected. These results show that the film (photoconductive layer) formed on the PET film is an amorphous film containing hydrogen.

-Evaluation-

Next, a circular Au electrode having a size of 3 mm is deposited on the photoconductive layer that has been formed on the PET formed with this ITO film, so that the thickness is 0.1 μm, to produce the light receiving element. Following this, a terminal wire is attached to the ITO electrode and the Au electrode using a silver paste. Next, the UV sensitivity of this device is measured in the same manner as that of Example 1.

The dark current (unirradiated) at this time is $1 \times 10^{-11}$ A. Moreover, when a UV light (Xe lamp light) is irradiated, an electromotive current of $0.1 \times 10^{-10}$ A flows. The output is 1/10 compared to a UV sensor utilizing polycrystalline gallium nitride as a photoconductive layer used for a commercially available UV meter (trade name: UV CAREMATE, made by Fuji Xerox Co., Ltd.), however it is found to be usable. Moreover, the light receiving element is exposed to visible light in the room, however it is not specifically reacted. The above results show that this element functions as a UV light receiving element.

Moreover, after forming the light receiving element, it is left in the atmosphere for 6 months, and then the same evaluation is performed. Similar results are obtained and no deterioration in the performance is found. Furthermore, after 6 months, the IR spectrum of the sample film is measured, and no change is found.

Comparative Example A1

A light receiving element using the same conductive base substance and the same film-forming apparatus as those of Example A1, and having a semiconductor film formed as a photoconductive layer is produced as follows. The film is formed under the same conditions except that the oxygen gas is not used.

-Analysis/Evaluation of Semiconductor Layer-

When forming a film on the PET film, the infrared absorption spectrum of a sample film that has been formed at the same time on the Si substrate fixed to the Al pipe, is measured, and peaks caused by the strong GA-H bond, weak Ga—N bond, and strong N—H bond are confirmed. From these, it is found that the surface layer contains a lot of nitrogen and hydrogen.

The diffraction figure obtained by RHEED (reflection high energy electron diffraction) measurement shows a halo pattern only, showing that the film is an amorphous film.

The composition of the sample film formed on the Si substrate is measured using Rutherford Back Scattering and Hydrogen Forward Scattering. The results show that gallium, nitrogen, and hydrogen are respectively 37, 43, and 20 atomic %. No carbon nor oxygen is detected.

-Evaluation-

Next, a light receiving element was produced in the same manner as that of Example 1, and the UV sensitivity is measured.

The dark current (unirradiated) at this time is $1 \times 10^{-9}$ A. Moreover, when a UV light (Xe lamp light) is irradiated, an electromotive current of $5 \times 10^{-8}$ A flows. The output is 1/100 or less compared to a UV sensor utilizing polycrystalline gallium nitride as a photoconductive layer used for a commercially available UV meter (trade name: UV CAREMATE, made by Fuji Xerox Co., Ltd.), and it is found to be unusable.

Furthermore, after 6 months, the IR spectrum of the sample film is measured. The peak of the Ga—H bond is decreased to ½.

<<Electrophotographic Photoreceptor>>

Example B1

Firstly, in the procedure described below, an organic photoreceptor where on the Al base substance is laminated the under coating layer, the charge generation layer, and the charge transport layer in this order, is produced.

-Formation of Under Coating Layer-

A solution obtained by stirring and mixing 20 weight parts of zirconium compound (trade name: ORGATICS ZC540, made by Matsumoto Chemical Industry Co., Ltd.), 2.5 weight parts of silane compound (trade name: A1100, made by Nippon Unicar Company Limited), 10 weight parts of polyvinyl butyral resin (trade name: S-LEC BM-S made by Sekisui Chemical Co., Ltd.), and 45 weight parts of butanol is coated on the surface of the Al base substance having an outer diameter of 84 mm, and heated and dried at 150° C. for 10 minutes, and thereby the under coating layer having a thickness of 1.0 μm is formed.

-Formation of Charge Generation Layer-

Next, a mixture obtained by mixing 1 weight part of chlorogallium phthalocyanine as the charge generating material, 1 weight part of polyvinyl butyral (trade name: S-LEC BM-S made by Sekisui Chemical Co., Ltd.), and 100 weight parts of n-butylacetate is dispersed with glass beads and a paint shaker for 1 hour, and a charge generation layer forming dispersion is obtained.

This dispersion is applied on the under coating layer by the dipping method, and then dried at 100° C. for 10 minutes, to form a charge generation layer having a thickness of 0.15 μm.

-Formation of Charge Transport Layer-

Next, 2 weight parts of the compound represented by the structural formula (1) below and 3 weight parts of the polymeric compound (volume average molecular weight: 39000) represented by the structural formula (2) below are dissolved in 20 weight parts of chlorobenzene, and the charge transport layer forming coating liquid is obtained.

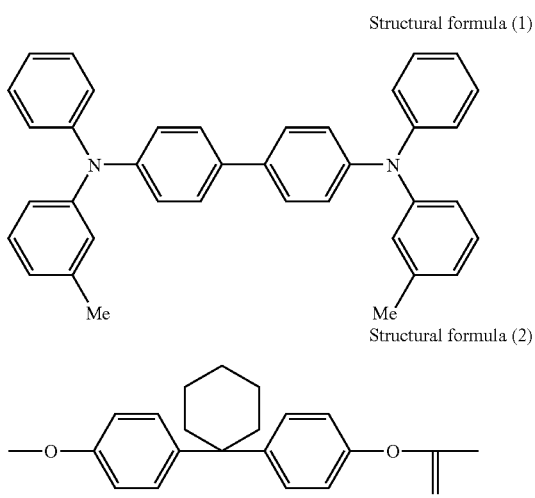

Structural formula (1)

Structural formula (2)

This coating liquid is applied on the charge generation layer by the dipping method, and heated at 110° C. for 40 minutes, to form a charge transport layer having a thickness of 20 μm. By so doing, an organic photoreceptor (hereunder, also called a "noncoat photoreceptor") where on the Al base substance is laminated the under coating layer, the charge generation layer, and the charge transport layer in this order, is obtained.

-Formation of Surface Layer-

The surface layer is formed on the noncoat photoreceptor surface using the film-forming apparatus having the structure shown in FIG. 4A and FIG. 4B.

Firstly, the noncoat photoreceptor is mounted on the base substance holder 13 in the film formation chamber 10 of the film-forming apparatus, and inside of the film formation chamber 10 is evacuated through the outlet 11 until the pressure becomes about 0.1 Pa. Next, about 450 sccm of a gas mixed with a nitrogen gas, a He gas, a hydrogen gas, and an oxygen gas (nitrogen gas 100 sccm, He gas 150 sccm, hydrogen gas 200 sccm, and oxygen gas 0.3 sccm) is introduced from the gas introduction pipe 20 into the high frequency discharge pipe portion 21 provided with the electrode 19 having a diameter of 100 mm, and electricity is discharged from the electrode 19 by setting radio waves of 13.56 MHz to an output of 100 W and matching by a tuner using the high frequency power supply section 18 and a matching circuit (not shown in FIG. 1). The reflected wave at this time is 0 W.

Next, a mixed gas containing a trimethylgallium gas having a hydrogen gas as a carrier gas is introduced through the gas introduction pipe 15 from the shower nozzle 16 into the plasma diffusion portion 17 in the film formation chamber 10 so that the flow rate of the trimethylgallium gas is 3 sccm. At this time, the reaction pressure in the film formation chamber 10 measured by a Baratron vacuum gauge is 40 Pa.

In this state, by forming a film for 60 minutes while rotating the noncoat photoreceptor at a speed of 1 rpm, a GaON film containing hydrogen having a thickness of 0.22 μm is formed, to obtain the organic photoreceptor provided with the surface layer on the surface of the charge transport layer. No heat is applied to the noncoat photoreceptor for forming the film. Moreover, the color of the thermo tape that has been previously adhered on the surface of the noncoat photoreceptor for monitoring the temperature at the time of film formation, is confirmed after the film formation, to be 45° C.

-Analysis/Evaluation of Semiconductor Layer-

When forming a film on the noncoat photoreceptor surface, the infrared absorption spectrum of a sample film that has been formed at the same time on the Si substrate, is measured, and peaks caused by the Ga—H bond, Ga—N bond, N—H bond, and Ga—ON are confirmed. From these, it is found that the surface layer contains gallium, nitrogen, hydrogen, and oxygen. The intensity of the absorption peaks caused by the N—H bond, Ga—H bond, and Ga—N bond are respectively 0.02, 0.005, and 0.005 in the relative value, and the half width of the absorption peak caused by the Ga—ON bond is 230 $cm^{-1}$.

The composition of the sample film is measured using Rutherford Back Scattering and Hydrogen Forward Scattering. The results show that gallium, nitrogen, oxygen, and hydrogen are respectively 35, 18, 30, and 17 atomic %. Oxygen is distributed on the whole film, and carbon contained in the surface layer is less than the detection limit (0.5 atomic %).

The diffraction figure obtained by RHEED (reflection high energy electron diffraction) measurement shows a halo pattern only, showing that the film is an amorphous film.

Moreover, even if the sample film formed on the Si substrate right after the film formation is soaked in water, there is no mark remaining. Furthermore, the contact angle with respect to pure water is 90°. Even if the surface is scratched with stainless steel or Si crystal, it is not blemished.

From the above analysis/evaluation results, it is found that the surface layer formed on the noncoat photoreceptor surface is an amorphous film, and gallium oxide nitride containing hydrogen, having a moisture resistance, a water repellency, and a sufficient hardness.

-Evaluation-

Next, the electrophotographic characteristics of the organic photoreceptor provided with this surface layer are evaluated. Firstly, with respect to the noncoat photoreceptor before forming the surface layer, and the photoreceptor provided with the surface layer, while scanning is performed over the photoreceptor surface using exposure light (light source: semiconductor laser, wavelength 780 nm, output 5 mW), and rotating is performed at 40 rpm, the residual charge on the surface is measured after irradiation in the state of negative electrification of –700V by a scorotron charger. As a result, it is found that the noncoat photoreceptor is –20V while the organic photoreceptor provided with the surface layer is –23V or less, having less temperature and humidity dependency at an excellent level.

Moreover, regarding the effect on the sensitivity, the wavelength of the light source is evaluated all over from the infrared region to the visible region. Almost no difference is found between the noncoat photoreceptor and the photoreceptor provided with the surface layer, showing that providing the surface layer does not decrease the sensitivity.

Furthermore, a peeling test is performed where an adhesive tape is peeled from the surface of the photoreceptor provided with the surface layer. The surface layer is not peeled off at all, showing excellent adhesiveness.

Next, the photoreceptor provided with this surface layer is attached to a DOCUCENTRE COLAR 500 made by Fuji Xerox Co., Ltd., and a continuous 20000 sheet printing test is performed under a high temperature and high humidity environment (28° C. and 80%). As a reference for evaluating the image, the noncoat photoreceptor is also attached to the DOCUCENTRE COLAR 500, and similar images are formed.

As a result, either at the beginning of the printing test or after completing the printing test, resolution of 10 lines/mm can be obtained in images having no image blur in halftone dots that are similarly clear as the image formed by using the noncoat photoreceptor at the beginning of the printing test. Moreover, the photoreceptor surface after the printing test is visually observed, and no blemish occurs and the wearing by means of thickness measurement is 0.0 µm. Furthermore, no discharged product adhered on the photoreceptor surface after the printing test is confirmed. The smoothness of the photoreceptor surface before the printing test is found to be excellent by a qualitative test where it is wiped by a clean tissue (Bemcot), having low friction. On the other hand, in the noncoat photoreceptor, blemishes occur on the photoreceptor surface after the printing test, and the wearing is 0.3 µm.

From the above results, it is found that the photoreceptor provided with the surface layer has increased durability, at a practically non-problematic level from the point of image quality, such as sensitivity and image blurs.

Example B2 to Example B9

The film is formed in the same manner as that of Example B1 except that the flow rate and the ratio of a gas containing trimethylgallium (TMG), $N_2$, He, $H_2$, and oxygen are changed as shown in Table 1. Thereby the organic photoreceptor formed with the surface layer is produced, and evaluated in the same manner as that of Example B1. The results are shown in Table 1.

Example B10 to Example B12

The film is formed in the same manner as that of Example B1 except that a gas containing trimethylaluminum (TMA) instead of trimethylgallium (TMG) is used, and the flow rate and the ratio of the gas containing trimethylaluminum (TMA), $N_2$, He, $H_2$, and oxygen are changed as shown in Table 1. Thereby the organic photoreceptor formed with the surface layer is produced, and evaluated in the same manner as that of Example B1. The results are shown in Table 1.

Comparative Examples B1 and B2

The film is formed in the same manner as that of Example B1 except that the flow rate and the ratio of a gas containing trimethylgallium (TMG), $N_2$, He, $H_2$, and oxygen are changed as shown in Table 1. Thereby the organic photoreceptor formed with the surface layer is produced, and evaluated in the same manner as that of Example B1. The results are shown in Table 1.

Comparative Example B3

The film is formed in the same manner as that of Example B10 except that the flow rate and the ratio of a gas containing trimethylaluminium (TMA), $N_2$, He, $H_2$, and oxygen are changed as shown in Table 1. Thereby the organic photoreceptor formed with the surface layer is produced, and evaluated in the same manner as that of Example B10. The results are shown in Table 1.

The photoreceptor of Comparative Examples 1 to 3 tends to have characteristics where the surface layer is oxidized if it is left in the atmosphere. However, the photoreceptor surface is not intentionally oxidized and the photoreceptor is attached to the image forming apparatus, to perform evaluation.

TABLE 1

| | Substrate surface temperature (°C.) | Flow rate (sccm) TMG/$H_2$ | Flow rate (sccm) $N_2$/He/$H_2$/$O_2$ | Surface layer composition (atomic %) Ga | N | O | hydrogen | Evaluation result of characteristics of surface layer hardness | smoothness | initial moisture resistance | initial contact angle | Image evaluation white striation | Image quality in high temperature/humidity |
|---|---|---|---|---|---|---|---|---|---|---|---|---|---|
| Example B1 | 40 | 3 | 100/150/200/0.3 | 35 | 18 | 30 | 17 | A | B | A | 90° | A | No image blur |
| Example B2 | 40 | 3 | 100/150/200/0.4 | 35 | 14 | 36 | 15 | A | B | A | 90° | A | No image blur |
| Example B3 | 40 | 3 | 100/150/200/0.8 | 35 | 13 | 37 | 15 | A | A | A | 91° | A | No image blur |
| Example B4 | 40 | 5 | 100/150/200/1.0 | 33 | 15 | 38 | 14 | A | A | A | 92° | A | No image blur |
| Example B5 | 40 | 5 | 100/450/0/2.0 | 35 | 10 | 40 | 15 | A | A | A | 92° | A | No image blur |
| Example B6 | 40 | 5 | 70/400/0/4.0 | 33 | 7 | 45 | 15 | A | A | A | 89° | A | No image blur |

| | substrate surface temperature (°C.) | Flow rate (sccm) TMG/$H_2$ | Flow rate (sccm) $N_2$/$H_2$/$O_2$ | Surface layer composition (atomic %) Ga | N | O | hydrogen | Evaluation results of characteristics of surface layer hardness | smoothness | initial moisture resistance | initial contact angle | Image evaluation white striation | Image quality in high temperature/humidity |
|---|---|---|---|---|---|---|---|---|---|---|---|---|---|
| Example B7 | 40 | 3 | 100/500/0.5 | 30 | 22 | 30 | 18 | A | A | A | 89° | A | No image blur |
| Example B8 | 40 | 3 | 100/500/2.0 | 30 | 20 | 34 | 16 | A | A | A | 89° | A | No image blur |
| Example B9 | 40 | 3 | 100/500/0.03 | 35 | 28 | 17 | 20 | A | A | A | 80° | A | No image blur |

TABLE 1-continued

| | substrate | | | Surface layer | | | | Evaluation results of characteristics of surface layer | | | | Image evaluation | |
|---|---|---|---|---|---|---|---|---|---|---|---|---|---|
| | surface temperature | Flow rate (sccm) | | composition (atomic %) | | | | hard-ness | smooth-ness | initial moisture resistance | initial contact angle | white striation | Image quality in high temperature/ humidity |
| | (° C.) | TMA/H$_2$ | N$_2$/H$_2$/O$_2$ | Al | N | O | hydrogen | | | | | | |
| Example B10 | 45 | 2 | 100/600/0.05 | 35 | 20 | 30 | 15 | A | A | A | 90° | A | No image blur |
| Example B11 | 50 | 2 | 100/600/0.1 | 35 | 16 | 35 | 14 | A | A | A | 91° | A | No image blur |
| Example B12 | 45 | 2 | 100/600/0.5 | 33 | 10 | 40 | 17 | A | A | A | 91° | A | No image blur |

| | substrate | | | Surface layer | | | | Evaluation results of characteristics of surface layer | | | | Image evaluation | |
|---|---|---|---|---|---|---|---|---|---|---|---|---|---|
| | surface temperature | Flow rate (sccm) | | composition (atomic %) | | | | hard-ness | smooth-ness | initial moisture resistance | initial contact angle | white striation | Image quality in high temperature/ humidity |
| | (° C.) | TMG/H$_2$ | N$_2$/He/H$_2$/O$_2$ | Ga | N | O | hydrogen | | | | | | |
| Comparative Example B1 | 40 | 3 | 100/50/200/0 No oxidization | 33 | 30 | 12 | 25 | A | B | C | 65° | B | Image blur |

| | substrate | | | Surface layer | | | | Evaluation results of characteristics of surface layer | | | | Image evaluation | |
|---|---|---|---|---|---|---|---|---|---|---|---|---|---|
| | surface temperature | Flow rate (sccm) | | composition (atomic %) | | | | hard-ness | smooth-ness | initial moisture resistance | initial contact angle | white striation | Image quality in high temperature/ humidity |
| | (° C.) | TMG/H$_2$ | N$_2$/H$_2$/O$_2$ | Ga | N | O | hydrogen | | | | | | |
| Comparative Example B2 | 40 | 3 | 100/500/0 No oxidization | 30 | 50 | 5 | 15 | A | B | C | 65° | B | Image blur |

| | substrate | | | Surface layer | | | | Evaluation results of characteristics of surface layer | | | | Image evaluation | |
|---|---|---|---|---|---|---|---|---|---|---|---|---|---|
| | surface temperature | Flow rate (sccm) | | composition (atomic %) | | | | hard-ness | smooth-ness | initial moisture resistance | initial contact angle | white striation | Image quality in high temperature/ humidity |
| | (° C.) | TMA/H$_2$ | N$_2$/H$_2$/O$_2$ | Al | N | O | hydrogen | | | | | | |
| Comparative Example B3 | 45 | 2 | 100/500/0 No oxidization | 35 | 28 | 13 | 24 | A | C | B | 10° | B | Image blur |

The evaluation methods and evaluation criteria in the respective items shown in Table 1 are as follows.

-Hardness-

The hardness is evaluated by the following criteria by visual observation regarding the occurrence of blemish on the film surface when a corner of Si crystal having a size of 5×10 mm is slightly pushed against and scratched on the film of about 10×10 mm that has been formed on the Si crystal substrate used for IR spectrum measurement.

A: No blemish occurs at all.
B: When the angle of observation on the surface of the scratched film is changed, blemish-like marks are found but there is no practical problem.
C: Remarkable blemishes are observed by eye on the film surface.

-Smoothness-

The smoothness is sensually evaluated regarding how smooth when the photoreceptor surface before the printing test is wiped by a clean tissue (Bemcot). The evaluation criteria is as follows.

A: No catching feeling between the Bemcot and the photoreceptor surface, and the smoothness is excellent.
B: A slight catching feeling between the Bemcot and the photoreceptor surface, but the smoothness is basically good.
C: A catching feeling between the Bemcot and the photoreceptor surface, and the Bemcot is torn in some cases.

-Initial Moisture Resistance-

The initial moisture resistance is evaluated by visual observation regarding the surface condition of the film, when the sample film formed on the Si substrate right after the film formation, is soaked in pure water for 10 second and then pulled up. The evaluation criteria is as follows.

A: No change is found at all on the film surface before and after being soaked in pure water.
B: A slight change is found on the film surface before and after being soaked in pure water, but it is hardly distinguished from water stain.
C: A change is found on the film surface before and after being soaked in pure water, and deliquescent like marks are found on the film surface after being soaked.

-Initial Contact Angle-

The initial contact angle is measured by dropping pure water on the sample film formed on the Si substrate right after the film formation, under an environment of 23° C. and 55% RH, using a contact angle CA-X roll type contact angle meter (made by Kyowa Interface Science Co., Ltd.). The mean value of repeated measurements for three times in different positions is obtained as the contact angle.

-White Striation-

Images before and after 20000 sheet printing are evaluated regarding white striation on the images. The evaluation criteria is as follows.

A: Almost no image defect of white striation is found.
B: A lot of image defects of white striation considered to be caused by blemishes on the photoreceptor.

-Image Blurs-

Regarding the image blurs, after the 20000 sheet printing test, only a part of the photoreceptor surface for removing water soluble discharged products is wiped with water.

Then, a halftone image (image density 30%) is printed, and it is judged whether any difference in density corresponding to the wiped part and the unwiped part on the photoreceptor surface, can visually be observed or not. If the difference in density is remarkable at a glance, it is judged that image blurs occur.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A semiconductor film formed on a base material, the semiconductor film consisting essentially of a group 13 element, nitrogen, hydrogen and oxygen, the oxygen being in an amount of about 15 atomic % or more of a total number of atoms, and
    wherein the group 13 element is in an amount of 30 atomic % or more.

2. The semiconductor film according to claim 1, wherein the base material comprises an organic material.

3. The semiconductor film according to claim 1, wherein the semiconductor film is photoconductive.

4. A method of manufacturing the semiconductor film of claim 1 comprising:
    making a nitrogen containing substance and an oxygen containing substance into an active species using an activation device that activates the nitrogen containing substance and the oxygen containing substance into an excited state or an energy state required for reaction; and
    reacting the active species and an organometallic compound containing an inactivated group 13 element, so as to form the semiconductor film.

5. The method of manufacturing the semiconductor film according to claim 4, wherein the organometallic compound containing the group 13 element is introduced downstream from the activation device that activates the nitrogen containing substance and the oxygen containing substance.

6. A light receiving element comprising a conductive base substance, a photoconductive layer, and an electrode, wherein the conductive base substance is laminated with the photoconductive layer and the electrode in this order, and the photoconductive layer consists essentially of a group 13 element, nitrogen, hydrogen and oxygen, the oxygen being in an amount of about 15 atomic % or more of a total number of atoms, and
    wherein the group 13 element is in an amount of 30 atomic % or more.

7. The light receiving element according to claim 6, wherein the conductive base substance comprises an insulating organic material provided with an electrode on a face in contact with the photoconductive layer.

8. An electrophotographic photoreceptor comprising a conductive base substance, a photosensitive layer, and a surface layer, wherein the conductive base substance is laminated with the photosensitive layer and the surface layer in this order, and the surface layer consists essentially of a group 13 element, nitrogen, hydrogen and oxygen, the oxygen being in an amount of about 15 atomic % or more of a total number of atoms, and
    wherein the group 13 element is in an amount of 30 atomic % or more.

9. The electrophotographic photoreceptor according to claim 8, wherein the photosensitive layer contains an organic material.

10. A process cartridge which integrally comprises an electrophotographic photoreceptor including a conductive base substance, a photosensitive layer, and a surface layer, the conductive base substance being laminated with the photosensitive layer and the surface layer in this order, and any one selected from the group consisting of an electrification device, a development device, a cleaning device, and an electricity removing device, and which is detachable from an image forming device main body, wherein
    the surface layer consists essentially of a group 13 element, nitrogen, hydrogen and oxygen, the oxygen being in an amount of about 15 atomic % or more of a total number of atoms, and
    wherein the group 13 element is in an amount of 30 atomic % or more.

11. The process cartridge according to claim 10, wherein the photosensitive layer contains an organic material.

12. An image forming device comprising: an electrophotographic photoreceptor including a conductive base substance, a photosensitive layer, and a surface layer, the conductive base substance being laminated with the photosensitive layer and the surface layer in this order; an electrification device that electrifies a surface of the electrophotographic photoreceptor; an exposure device that exposes the electrophotographic photoreceptor surface electrified by the electrification device to form an electrostatic latent image; a development device that develops the electrostatic latent image by a developer containing a toner to form a toner image; and a transfer device that transfers the toner image onto a recording media, wherein
    the surface layer consists essentially of a group 13 element, nitrogen, hydrogen and oxygen, the oxygen being in an amount of about 15 atomic % or more of a total number of atoms, and
    wherein the group 13 element is in an amount of 30 atomic % or more.

13. The image forming device according to claim 12, wherein the photosensitive layer contains an organic material.

14. The semiconductor film according to claim 1, wherein the oxygen is in the amount of 28 atomic % or more.

15. The light receiving element according to claim 6, wherein the oxygen is in the amount of 28 atomic % or more.

* * * * *